United States Patent
Okanobu

(10) Patent No.: US 8,208,076 B2
(45) Date of Patent: Jun. 26, 2012

(54) FRONT END CIRCUIT

(75) Inventor: Taiwa Okanobu, Tokyo (JP)

(73) Assignee: Sony Corporation, Tokyo (JP)

( * ) Notice: Subject to any disclaimer, the term of this patent is extended or adjusted under 35 U.S.C. 154(b) by 512 days.

(21) Appl. No.: 12/521,090

(22) PCT Filed: Oct. 2, 2007

(86) PCT No.: PCT/JP2007/069258
§ 371 (c)(1),
(2), (4) Date: Jun. 24, 2009

(87) PCT Pub. No.: WO2008/078440
PCT Pub. Date: Jul. 3, 2008

(65) Prior Publication Data
US 2010/0026906 A1    Feb. 4, 2010

(30) Foreign Application Priority Data
Dec. 26, 2006   (JP) ................... 2006-349344

(51) Int. Cl.
*H04N 5/50* (2006.01)
(52) U.S. Cl. .......................... 348/731; 348/725
(58) Field of Classification Search .............. 348/725, 348/731; 455/179.1, 180.1–180.3, 182.1–182.2, 455/188.1–189.1
See application file for complete search history.

(56) References Cited

U.S. PATENT DOCUMENTS

| | | | |
|---|---|---|---|
| 4,851,796 A | 7/1989 | Hendriks | |
| 7,233,368 B2 | 6/2007 | Brilka et al. | |
| 7,639,311 B2* | 12/2009 | Tai | 348/731 |
| 2005/0085201 A1 | 4/2005 | Martin et al. | |
| 2005/0225679 A1* | 10/2005 | Okanobu | 348/571 |
| 2006/0018290 A1 | 1/2006 | Zhao | |

FOREIGN PATENT DOCUMENTS

| | | |
|---|---|---|
| JP | 05-252072 | 9/1993 |
| JP | 2001-501408 | 1/2001 |
| JP | 2001-053553 | 2/2002 |

(Continued)

OTHER PUBLICATIONS

International Search Report corresponding to PCT/JP07/069258.

(Continued)

*Primary Examiner* — Hunter Lonsberry
(74) *Attorney, Agent, or Firm* — SNR Denton US LLP

(57) ABSTRACT

An IC of a front end circuit which can be ready for various television broadcasting systems is provided. The front end circuit includes tuning circuits 12A to 12C and 14A to 14C and high frequency amplifiers 13A to 13C individually corresponding to a plurality of reception bands of television broadcasts. The front end circuit further includes a switch circuit 11 for selectively supplying reception signals to the tuning circuits 12A to 12C, and a switch circuit 15 for selectively extracting outputs of the tuning circuits 14A to 14C. The front end circuit further includes mixer circuits 21I and 21Q to which an output of the switch circuit 15 is supplied, and a PLL 30 for supplying local oscillation signals SLOI and SLOQ having phases orthogonal to each other to the mixer circuits 21I and 21Q. The front end circuit further includes a complex band-pass filter 24 to which outputs of the mixer circuits 21I and 21Q are supplied, and an output circuit 25 for mathematically operating an output of the complex band-pass filter 24 and outputting an intermediate frequency signal SIF.

12 Claims, 10 Drawing Sheets

FOREIGN PATENT DOCUMENTS

| | | |
|---|---|---|
| JP | 2004-215034 | 7/2004 |
| JP | 2004-282425 | 10/2004 |
| JP | 2004-531967 | 10/2004 |
| JP | 2004-533167 | 10/2004 |
| JP | 2005-303650 | 10/2005 |
| JP | 2005-311560 | 11/2005 |
| JP | 2005-333485 A | 12/2005 |
| WO | 2005/039063 A1 | 4/2005 |

OTHER PUBLICATIONS

Japanese Patent Office, Office Action issued in Patent Application JP 2006-349344, on Dec. 7, 2010.

* cited by examiner

FRONT END CIRCUIT

TECHNICAL FIELD

This invention relates to a front end circuit for a television receiver.

BACKGROUND ART

As a front end circuit (tuner section) for a television receiver, front end circuits by which the channel can be switched over a wide range have been proposed. For example, a front end circuit is available wherein an antenna input is divided into three reception bands and a power supply voltage is selectively supplied to high frequency circuits for the respective reception bands such that tuning is carried out with an object channel and then the tuned output is supplied to a mixer circuit.

Also a front end circuit of the so-called low IF conversion type wherein the number of parts is reduced by forming the front end circuit as an IC and the intermediate frequency is set considerably lower than the reception frequency and another front end circuit of the so-called direct conversion type wherein a local oscillation frequency is set equal to the reception frequency to make the intermediate frequency zero are available. With the front end circuits of the low IF conversion type and the direct conversion type, since they become worse in terms of the image disturbance, intermediate frequency signals on the I axis and the Q axis are formed and the image disturbance signal is canceled by a phase process.

It is to be noted that, as prior art documents, for example, U.S. Pat. No. 4,851,796, U.S. Patent No. 20060189290, Japanese Patent No. 23615099 and Japanese Translation of PCT Application No. 2004-531967 are available.

However, according to the type wherein an antenna input is divided into three reception bands to carry out tuning with an object channel as described above, a very great number of parts are required, and besides, tracking adjustment is carried out by changing the shape of an air-cored coil of a tuning circuit. Therefore, the front end circuit of the type described encounters with a significant trouble in reduction of the size and the cost.

In this connection, if the front end circuit of the type described is formed as an IC, the number of parts can be reduced. However, in a system which adopts a wide-band high-frequency amplifier, a great dynamic range becomes required in order to satisfy the demand for a multi-channel disturbance characteristic, and it is very difficult to achieve both of reduction of the voltage and reduction of power consumption and characteristics of the gain and the noise factor NF.

This invention contemplates solution to such problems as described above.

DISCLOSURE OF INVENTION

According to the present invention, there is provided a front end circuit, wherein a plurality of series circuits having tuning circuits and high frequency amplifiers individually corresponding to a plurality of reception bands into which television broadcasts are divided, a first switch circuit for selectively supplying a reception signal to the plural series circuits, a second switch circuit for selectively extracting an output of the plural series circuits in an interlocking relationship with the first switch circuit, first and second mixer circuits to which the reception signal outputted from the second switch circuit is supplied, a PLL for supplying first and second local oscillation signals having phases orthogonal to each other to the first and second mixer circuits, a complex band-pass filter to which outputs of the first and second mixer circuits are supplied, and an output circuit for mathematically operating an output of the complex band-pass filter and outputting an intermediate frequency signal, are formed as an IC;

switching among the plural reception bands is carried out by switching of the first and second switch circuits; and the tuning frequency of the tuning circuit in the switched reception band and the frequency of the first and second local oscillation signals to be supplied from the PLL to the first and second mixer circuits are varied to obtain an intermediate frequency signal of an object channel.

According to the present invention, a front end circuit can be implemented from a further reduced number of parts without deteriorating the disturbance characteristic over a wide frequency range. And, the front end circuit can be coped with by an IC of one chip. Further, it is possible to cope with a difference in the broadcasting system such as digital broadcasting and analog broadcasting or with a difference in the broadcasting system among districts in the world.

BEST MODE FOR CARRYING OUT THE INVENTION

[1] Example of the (Entire) Reception Circuit

Frequencies (channels) used for television broadcasting differ among different countries, and also for the color television system, NTSC, PAL, SECAM and so forth are available. Further, not only analog broadcasts but also digital broadcasts are available.

Thus, it seems a possible idea to divide a reception signal system of a television broadcast into a front end circuit which receives a television broadcast and outputs an intermediate frequency signal, and a base band processing circuit which processes an output of the front end circuit and outputs a color image signal and a sound signal. In short, it is intended to cope with a difference in the broadcasting system of a television broadcast by such countermeasure.

Therefore, an example of a front end circuit and a base band processing circuit to which the present invention can be applied are described.

[1-1] Example of the Front End Circuit

Figure 1:
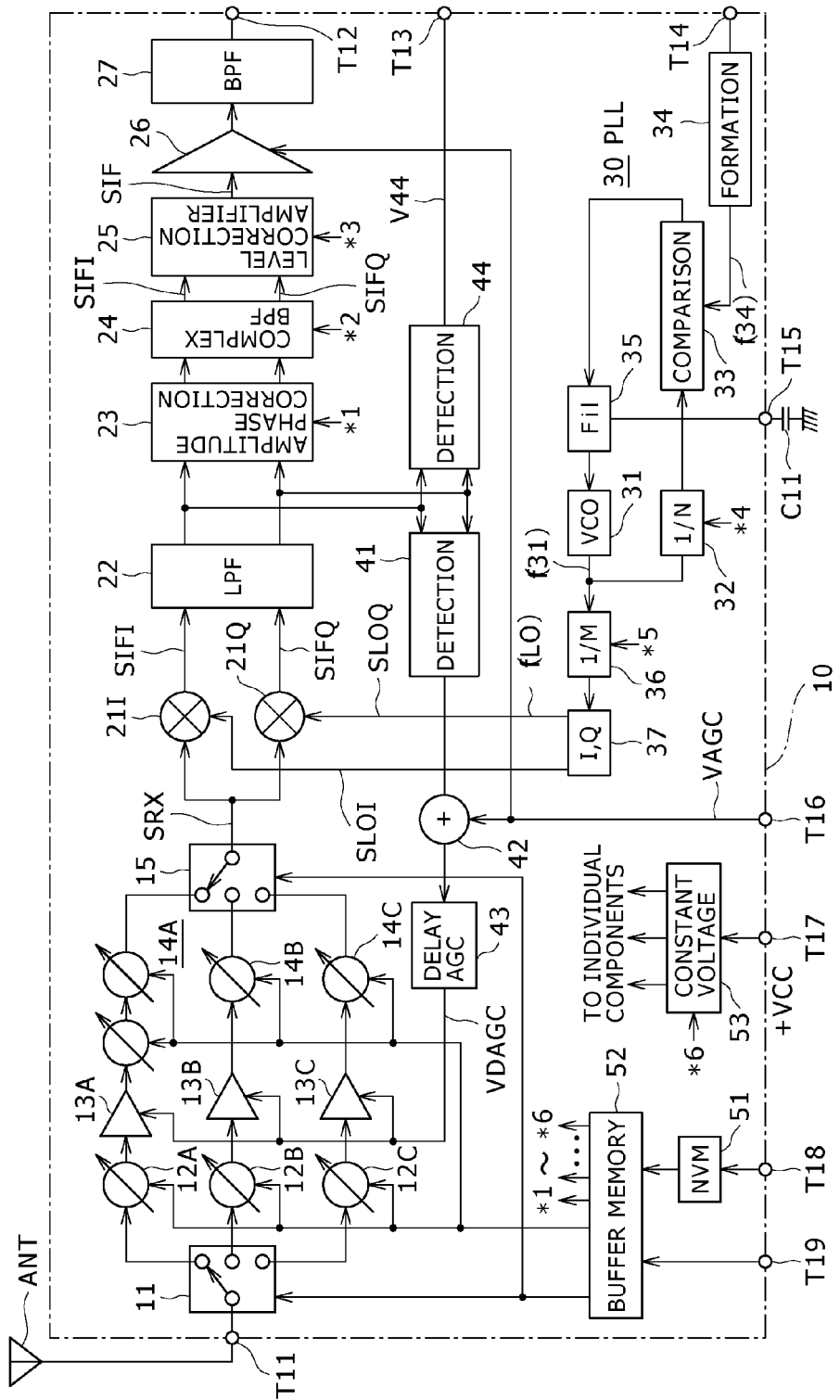
FIG. 1 is a system diagram showing a form of a front end circuit according to the present invention.

FIG. 1 shows an example of a front end circuit which can receive television broadcasts of different countries irrespective of the broadcasting form. In the present example, frequencies used in television broadcasts in different countries are divided into three bands of (A) 46 to 147 MHz (VL band)
(B) 147 to 401 MHz (VH band) and
(C) 401 to 887 MHz (U band)

and, in each of the reception bands, the frequency can be changed in accordance with an object channel.

In particular, referring to FIG. 1, a portion 10 surrounded by a chain line denotes the front end circuit, and this is formed an IC in the form of a 1-chip IC. Further, this IC (front end circuit) 10 has terminal pins T11 to T19 for external connection.

Broadcasting wave signals of television broadcasts are received by an antenna ANT, and reception signals of them are selectively supplied from the terminal pin T11 to the antenna tuning circuits 12A to 12C through a switch circuit 11. In this instance, the antenna tuning circuits 12A to 12C correspond to the reception bands of the items (A) to (C) above, respectively, and are configured such that the capacitance of a tuning capacitor is changed with digital data to change the tuning frequency, and as a result, tuning with a reception signal of an object frequency (channel) is carried out. It is to be noted that details are hereafter described.

The reception signals of the antenna tuning circuits 12A to 12C are supplied to a switch circuit 15 through high frequency amplifiers 13A to 13C and further through interstage tuning circuits 14A to 14C. The switch circuit 15 is changed over in an interlocked relationship with the switch circuit 11, and accordingly, a reception signal SRX of an object reception band is extracted from the switch circuit 15. The extracted reception signal SRX is supplied to mixer circuits 21I and 21Q.

It is to be noted that, while also the tuning circuits 14A to 14C are configured similarly to the tuning circuits 12A to 12C, the tuning circuit 14A is formed as a double tuning circuit. Further, as hereinafter described, the tuning capacitors of the tuning circuits 12A to 14C are built in the IC 10 while tuning coils are externally connected to the IC 10.

Further, an oscillation signal of a predetermined frequency is formed by a VCO 31. This VCO 31 is for forming a local oscillation signal and forms part of a PLL 30. In particular, the oscillation signal of the VCO 31 is supplied to a variable dividing circuit 32, by which it is divided into a signal of a frequency of 1/N (N is a positive integer), and this divided signal is supplied as a reference signal to a phase comparison circuit 33. Further, a clock (whose frequency is approximately 1 to 2 MHz) is supplied from the outside to a signal formation circuit 34 through the terminal pin T14, and the clock is divided into a signal of a predetermined frequency f34 by the signal formation circuit 34. This frequency signal is supplied as a reference signal to the phase comparison circuit 33.

And, a comparison output of the phase comparison circuit 33 is supplied to a loop filter 35, from which a dc voltage whose level varies in accordance with a phase difference between an output signal of the variable dividing circuit 32 and an output signal of the signal formation circuit 34. This dc voltage is supplied as a control voltage for an oscillation frequency f31 to the VCO 31. It is to be noted that a smoothing capacitor C11 is externally connected to the filter 35 through the terminal pin T15.

Accordingly, since the oscillation frequency f31 of the VCO 31 becomes $$f31 = N \cdot f34 \quad (1)$$

if the dividing ration N is controlled by a microcomputer (not shown) for system control, then the oscillation frequency f31 of the VCO 31 can be varied. For example, the frequency f31 is 1.8 to 3.6 GHz in response to the reception band and the reception frequency (reception channel).

Then, the oscillation signal of the VCO 31 is supplied to a variable dividing circuit 36, by which it is divided to 1/M (for example, M=2, 4, 8, 16, 32), and this divided signal is supplied to a dividing circuit 37, by which it is divided into division signals SLOI and SLOQ which have a frequency of ½ and have phases orthogonal to each other. The signals SLOI and SLOQ are supplied as local oscillation signals to mixer circuits 21I and 21Q.

Here, if
fLO: frequency of the local oscillation signals SLOI and SLOQ
then $$fLO = f31/(2M) \quad (2)$$
$$= N \cdot f34/(2M)$$
$$= f34 \cdot N/(2M)$$

Accordingly, by changing the dividing ratio M, N, the local oscillation frequency fLO can be varied by a predetermined frequency step over a wide range.

Further, it is assumed that
SRX: reception signal desired to be received
SUD: image interfering signal and, for the simplification, $$SRX = ERX \cdot \sin \omega RXt$$

ERX: amplitude of the reception signal SRX
ωRX=2 πfRX
fRX: center frequency of the reception signal SRX $$SUD = EUD \cdot \sin \omega UDt$$

EUD: amplitude of the image interfering signal SUD
ωUD=2 πfUD
fUD: center frequency of the image interfering signal SUD
Further, regarding the local oscillation signals SLOI and SLOQ, $$SLOI = ELO \cdot \sin \omega LOt$$

$$SLOQ = ELO \cdot \cos \omega LOt$$

ELO: amplitude of the signals SLOI and SLOQ
ωLO=2 πfLO
However, if, in this instance, $$\omega IF = 2 \pi fIF$$

fIF: intermediate frequency. For example, 4 to 5.5 MHz (changed in accordance with the broadcasting system)
then, in the case of the upper heterodyne, $$fRX = fLO - fIF$$

$$fUD = fLO + fIF$$

Accordingly, such signals SIFI and SIFQ as given below are outputted from the mixer circuits 21I and 21Q. In particular, signals of SIFI and SIFQ, $$SIFI = (SRX + SUD) \times SLOI$$
$$= ERX \cdot \sin\omega RXt \times ELO \cdot \sin\omega LOt + EUD \cdot \sin\omega UDt \times ELO \cdot \sin\omega LOt$$
$$= \alpha\{\cos(\omega RX - \omega LO)t - \cos(\omega RX + \omega LO)t\} + \beta\{\cos(\omega UD - \omega LO)t - \cos(\omega UD + \omega LO)t\}$$

$$SIFQ = (SRX + SUD) \times SLOQ$$
$$= ERX \cdot \sin\omega RXt \times ELO \cdot \cos\omega LOt + EUD \cdot \sin\omega UDt \times ELO \cdot \cos\omega LOt$$
$$= \alpha\{\sin(\omega RX + \omega LO)t + \sin(\omega RX - \omega LO)t\} + \beta\{\sin s(\omega UD + \omega LO)t - \sin(\omega UD - \omega LO)t\}$$

$$\alpha = ERX \cdot ELO / 2$$
$$\beta = EUD \cdot ELO / 2$$

are extracted.

The signals SIFI and SIFQ are supplied to a low-pass filter 22 which has a wide band in comparison with an occupation bandwidth (for example, 6 to 8 MHz) of the image intermediate frequency and the sound intermediate frequency. As a result, the low-pass filter 22 removes the signal components of the sum angular frequencies ($\omega RX + \omega LO$) and ($\omega UD + \omega LO$) (and the local frequency signals SLOI and SLOQ), and $$SIFI = \alpha \cdot \cos(\omega RX - \omega LO)t + \beta \cdot \cos(\omega UD - \omega LO)t \quad (3)$$
$$= \alpha \cdot \cos\omega IFt + \beta \cdot \cos\omega IFt$$

$$SIFQ = \alpha \cdot \sin(\omega RX - \omega LO)t + \beta \cdot \sin(\omega UD - \omega LO)t \quad (4)$$
$$= -\alpha \cdot \sin\omega IFt + \beta \cdot \sin\omega IFt$$

are extracted from the low-pass filter 22.

Then, the signals SIFI and SIFQ are supplied to a complex band-pass filter (polyphase band-pass filter) 24 through an amplitude phase correction circuit 23 hereinafter described. This complex band-pass filter 24 has characteristics that (a) it has a frequency characteristic of a band-pass filter; that to each other.

Then, the signals SIFI and SIFQ are supplied to a level correcting amplifier 25, by which the signal SIFI and the signal SIFQ are added, and such a signal SIF as given below is extracted from the level correcting amplifier 25.

In particular, $$SIF = SIFI + SIFQ \quad (7)$$
$$= 2\alpha \cdot \cos\omega IFt$$
$$= ERX \cdot ELO \cdot \cos\omega IFt$$

is extracted. This extracted signal SIF is nothing but an intermediate frequency when the reception signal SRX is received by the upper heterodyne system. And, this intermediate frequency signal SIF does not include the image interfering signal SUD. It is to be noted that the amplitude phase correction circuit 23 corrects the amplitude and the phase of the signals SIFI and SIFQ so that the expression (7) is satisfied sufficiently, that is, so that the image interfering signal SUD may be minimized.

Further, at this time, the level correcting amplifier 25 corrects the level of the signal SIF so that, even if the level of the signals SIFI and SIFQ differs depending upon the difference of the broadcasting system, an AGC characteristic (particularly a starting level of the AGC) hereinafter described may not change.

Then, this intermediate frequency signal SIF is outputted to the terminal pin T12 through a variable gain amplifier 26 for AGC and further through a band-pass filter 27 for cutting of a dc component and for aliasing.

Accordingly, if the dividing ratio M, N is changed, then an object frequency (channel) can be selected in accordance with the expression (2), and if the intermediate frequency signal SIF outputted to the terminal pin T12 is demodulated in accordance with the broadcasting system, then an object broadcast can be enjoyed.

In this manner, according to the present front end circuit 10, the wide frequency range of 46 to 887 MHz can be coped with using a one-chip IC. Further, the front end circuit 10 can be implemented with a reduced number of parts without deteriorating the disturbance (b) it has a phase shift characteristic as well and shifts the phase of the signal SIFI by a value $\phi$ ($\phi$ is an arbitrary value); that (c) it similarly shifts the phase of the signal SIFQ by another value ($\phi - 90°$); and that (d) it has two band-pass characteristics having center frequencies at a frequency f0 and another frequency −f0 which are symmetrical with each other with respect to the zero frequency and can select them in accordance with a relative phase of the input signals.

Accordingly, the complex band-pass filter 24 delays the phase of the signal SIFQ by 90° with respect to the signal SIFI based on the items (b) and (c) to $$SIFI = \alpha \cdot \cos\omega IFt + \beta \cdot \cos\omega IFt \quad (5)$$

$$SIFQ = -\alpha \cdot \sin(\omega IFt - 90°) + \beta \cdot \sin(\omega IFt - 90°) \quad (6)$$
$$= \alpha \cdot \cos\omega IFt - \beta \cdot \cos\omega IFt$$

In short, between the signal SIFI and the signal SIFQ, the signal components $\alpha \cdot \cos \omega IFt$ have the same phase while the signal components $\beta \cdot \cos \omega IFt$ have the opposite phases characteristic over a wide frequency range. Furthermore, the single front end circuit 10 can cope with the difference in the broadcasting system between digital broadcasting and analog broadcasting or with the difference of the broadcasting system depending upon the area in the world.

Further, the reception disturbance by harmonics of a clock signal is reduced, and as a result, the reception sensitivity is enhanced. Further, since all circuit parts of the PLL 30 can be formed on a chip except the capacitor C11, it can be formed as a PLL which is tough against disturbance and little suffers from occurrence of disturbance. Further, since only the tuning circuits 14A to 14C are connected to the high frequency amplifiers 13A to 13C, respectively, the load is light and the high frequency amplifiers 13A to 13C have a low distortion feature.

[1-1-1] Example of the AGC

An AGC voltage VAGC is formed by a base-band processing circuit hereinafter described, and this AGC voltage VAGC is supplied as a control signal for the gain of the variable gain amplifier 26 for AGC to the variable gain amplifier 26 for AGC through a terminal pin T16. Consequently, ordinary AGC is carried out.

Further, for example, where the level of the object reception signal SRX is excessively high or the reception signal SRX has a disturbance wave signal of a high level mixed therein, the ordinary AGC cannot cope with this. Therefore, the signals SIFI and SIFQ outputted from the low-pass filter 22 are supplied to a level detection circuit 41, by which it is detected whether or not the level of the signals SIFI and SIFQ before the AGC is carried out by the variable gain amplifier 26 exceeds a predetermined value. And, this detection signal and the AGC voltage VAGC of the terminal pin T16 are supplied to an addition circuit 42, and an addition output of the addition circuit 42 is supplied to a forming circuit 43, by which a delay AGC voltage VDAGC is formed. This delay AGC voltage VDAGC is supplied as a gain control signal to the high frequency amplifiers 13A to 13C to carry out delay AGC.

Accordingly, since optimum AGC operation can be carried out from the D/U between the strength of the desired reception signal and the strength of many signals whose reception is not desired, a desired broadcast can be received favorably from among digital broadcasts and analog broadcasts or even if they are mixed with each other.

[1-1-2] Example of the Voltages for Testing-Adjustment

The signals SIFI and SIFQ outputted from the low-pass filter 22 are supplied to and detected and smoothed by a linear detection circuit 44 to form a dc voltage V44 indicative of the level of the signals SIFI and SIFQ, and this voltage V44 is outputted to the terminal pin T13.

The dc voltage V44 outputted to the terminal pin T13 is used upon testing or adjustment of the front end circuit 10. For example, the dc voltage V44 can be used to check the level of an input signal (reception signal) over a wide frequency range. In particular, different from an output passed through an intermediate frequency filter of a narrow band, the dc voltage V44 can be used to directly check the attenuation characteristic over a wide band regarding signal lines from the antenna terminal pin T11 to the mixer circuits 21I and 21Q.

On the other hand, when the antenna tuning circuits 12A to 12C and the interstage tuning circuits 14A to 14C are to be adjusted, if an input test signal is applied to the terminal pin T11 and the AGC voltage VAGC to be applied to the terminal pin T16 is fixed to a predetermined value, then tracking adjustment can be carried out from a variation of the dc voltage V44. Further, adjustment of functions and measurement of a characteristic of the front end circuit 10 can be carried out with digital data to carry out automatic adjustment and automatic measurement.

[1-1-3] Constant Voltage Circuit

The IC 10 includes a constant voltage circuit 53, to which a power supply voltage +VCC is supplied from the terminal pin T17. This constant voltage circuit 53 utilizes a band gap of the PN junction to form a fixed voltage of a predetermined value from a power supply voltage +Vcc, and the formed fixed voltage is supplied to the individual circuits of the IC 10. It is to be noted that the output voltage of the constant voltage circuit 53 can be adjusted finely.

Accordingly, even where the circuits are formed from MOS-FETs, the voltage to be supplied to the circuits can be set rather high, and the performance of the MOS-FETs can be extracted to the utmost.

[1-1-4] Initialization

Since the correction amount of the amplitude phase correction circuit 23, the center frequency and the passband width of the complex band-pass filter 24 and the gain of the level correcting amplifier 25 need conform with a broadcasting system of a television broadcast to be received, they are variable and can be set from the outside. For example, the center frequency of the complex band-pass filter 24 is variable within a range of 3.8 to 5.5 MHz and the passband of the complex band-pass filter 24 is variable within a range of 5.7 to 8 MHz.

And, upon assembly, upon shipment from a factory or in a like case, the preset values of the circuits 23 to 25 are written from the terminal pin T18 into a nonvolatile memory 51. Further, also data for tracking of the tuning circuits 12A to 12C and 14A to 14C (data for fine adjustment of the tuning frequency) and data for adjustment of the output voltage of the constant voltage circuit 53 are written similarly from the terminal pin T18 into the nonvolatile memory 51. Accordingly, the characteristic of the individual circuits can be set to that ready for the broadcasting system of a television broadcast to be received.

[1-1-5] Operation Upon Use

Also when the power supply to the receiver which uses this IC 10 is powered on, the preset values of the nonvolatile memory 51 are copied into a buffer memory 52, and the copied preset values are supplied individually as default values into the circuits 12A to 12C, 14A to 14C, 23 to 25 and 53.

Then, if the user selects a channel, then data thereof is supplied to and stored once into the buffer memory 52 from a microcomputer (not shown) for system control through the terminal pin T19, and the stored data are supplied to the switch circuits 11 and 15, tuning circuits 12A to 12C, 14A to 14C and variable dividing circuits 32 and 36. Consequently, a reception band including an object channel (frequency) is selected, and the object channel is selected in the selected reception band.

[1-1-6] Summary

With the front end circuit 10 shown in FIG. 1, television broadcasts in the frequency band of 46 to 887 MHz as indicated by the items (A) to (C) can be received. Then, at this time, since the center frequency and the pass-band width of the complex band-pass filter 24 are variable, the front end circuit 10 can cope not only with ground wave digital television broadcasts and ground wave analog television broadcasts in Japan but also with digital television broadcasts and analog television broadcasts outside Japan.

[1-2] Example of the Base-Band Processing Circuit

Figure 2:
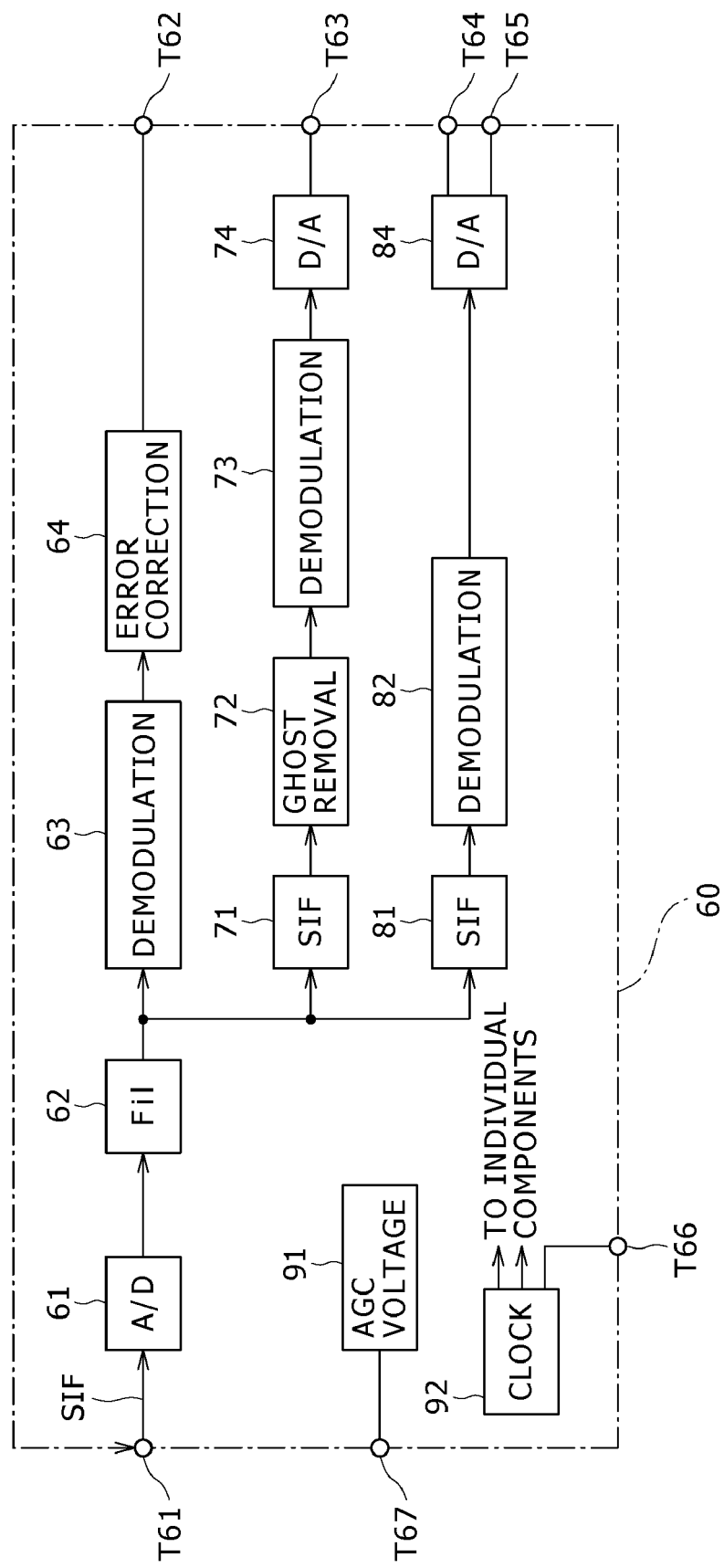
FIG. 2 is a system diagram showing a form of a base band processing circuit which can be connected to the circuit of FIG. 1.

FIG. 2 shows an example of the base-band processing circuit, and this is for processing the intermediate frequency signal SIF outputted from the front end circuit 10 to output a color image signal and a sound signal. In particular, referring to FIG. 2, a portion 60 surrounded by a chain line indicates the base-band processing circuit, which is formed as an IC in the form of a 1-chip IC. Further, the IC (base band processing circuit) 60 has terminal pins T61 to T67 for external connection.

And, the intermediate frequency signal SIF outputted from the terminal pin T12 of the front end circuit 10 is supplied from the terminal pin T61 to an A/D converter circuit 61, by which it is A/D converted into a digital intermediate frequency signal. From this digital intermediate frequency signal SIF, unnecessary frequency components are removed by a filter 62.

Then, upon reception of a digital television broadcast, the digital intermediate frequency signal SIF from the filter 62 is supplied to a demodulation circuit 63, by which a digital signal of the base band is demodulated and extracted. This demodulation output is supplied to an error correction circuit 64, by which it is converted into an error-corrected data stream. This data stream is outputted to the terminal pin T62. Accordingly, if the signal of the terminal pin T62 is decoded in accordance with the broadcasting system thereof, then the original color image signal and sound signal can be obtained.

On the other hand, upon reception of an analog television broadcast, the digital intermediate frequency signal SIF from the filter 62 is supplied to an image intermediate frequency filter 71, by which a digital image intermediate frequency signal is extracted. This signal is supplied, after ghost components are removed therefrom by a ghost removing circuit 72, to a demodulation circuit 73, by which a digital color image signal is demodulated. Then, this digita signal is supplied to a D/A converter circuit 74, by which it is D/A converted into an analog color image signal, and this color image signal is outputted to the terminal pin T63.

Further, upon reception of an analog television broadcast, the digital intermediate frequency signal SIF from the filter 62 is supplied to a sound intermediate frequency filter 81, by which a digital sound intermediate frequency signal is extracted. This signal is supplied to a demodulation circuit 82, by which a digital sound signal is demodulated. Then, this digital sound signal is supplied to a D/A converter circuit 84, by which it is D/A converted into sound signals of the left and right channels. Those sound signals are outputted to the terminal pins T64 and T65.

Further, an AGC voltage VAGC is formed by an AGC voltage forming circuit 91, and this AGC voltage VAGC is outputted to the terminal pin T67 and supplied to the terminal pin T16 of the front end circuit 10. Consequently, ordinal AGC and delay AGC are carried out as described hereinabove.

Further, a clock forming circuit 92 forms a clock of a predetermined frequency, and this clock is supplied to the components of the base band processing circuit 60 and is supplied to the signal formation circuit 34 through the terminal pin T66 and further through the terminal pin T14 of the front end circuit 10. Accordingly, the reception disturbance by harmonics of the clock signal and so forth is reduced, and as a result, the reception sensitivity is enhanced.

[2] Example of the High Frequency Stage

Figure 3:
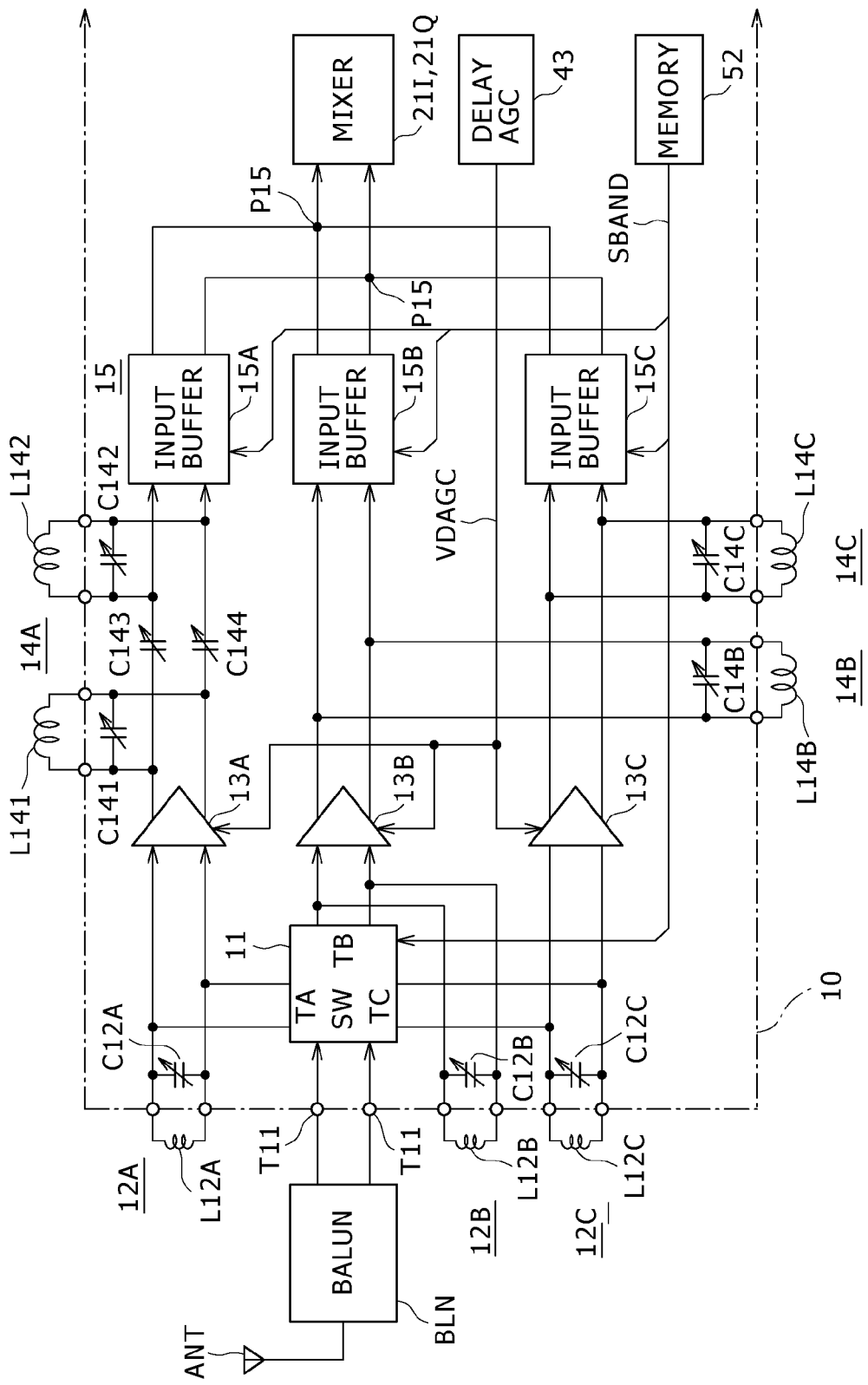
FIG. 3 is a system diagram showing a form of a high frequency stage of the front end circuit.

FIG. 3 shows an example of a high frequency signal system from the switch circuit 11 to the switch circuit of the front end circuit 10. It is to be noted that also this high frequency signal system is formed as that of the balance type.

In particular, reception signals of the antenna ANT are supplied to the switch circuit 11 through the terminal pins T11, T11 after they are converted into balanced reception signals by a balun BLN. Although a particular example is hereinafter described, this switch circuit 11 is formed equivalently as seen in FIG. 1 and selectively supplies reception signals supplied thereto through the terminal pins T11, T11 to the antenna tuning circuits 12A to 12C.

To this end, the switch circuit 11 is connected at first output terminals TA thereof to input terminals of the high frequency amplifier 13A, and the antenna tuning circuit 12A is connected in parallel to signal lines between the first output terminals TA of the switch circuit 11 and the input terminals of the high frequency amplifier 13A. In this instance, the tuning circuit 12A is formed such that a tuning coil L12A is externally connected to the IC 10 through terminals pin and a tuning capacitor C12A is built in the IC 10. It is to be noted that the capacitance of the capacitor C12A is changed with digital data to change the tuning frequency as hereinafter described.

Further, output terminals of the high frequency amplifier 13A are connected to input terminals of the input buffer circuit 15A through tuning capacitors C143 and C144, and a tuning coil L141 and a tuning capacitor C141 are connected in parallel to the output terminals of the high frequency amplifier 13A. Meanwhile, a tuning coil L142 and a tuning capacitor C142 are connected in parallel to input terminals of the input buffer circuit 15A. Thus, the interstage tuning circuit 14A is formed in a double tuning form.

It is to be noted that, at this time, the coils L141 and L142 are externally connected to the IC 10 through terminal pins. Further, the capacitors C141 to C144 are built in the IC 10, and the capacitance of them is changed with digital data to vary the tuning frequency. A high frequency stage of the VL band indicated in the item (A) is formed in this manner.

Meanwhile, second output terminals TB of the switch circuit 11 are connected to input terminals of the high frequency amplifier 13B, and the antenna tuning circuit 12B is connected in parallel to signal lines between the second output terminals TB of the switch circuit 11 and input terminals of the high frequency amplifier 13B.

Further, output terminals of the high frequency amplifier 13B are connected to input terminals of the input buffer circuit 15B, and a tuning coil L14B and a tuning capacitor C14B are connected in parallel to signal lines between the output terminals of the high frequency amplifier 13B and the input terminals of the input buffer circuit 15B to form the interstage tuning circuit 14B. It is to be noted that, at this time, the coils L12B and L14B are externally connected to the IC 10 through terminal pins while the capacitors C12B and C14B are built in the IC 10 and the capacitance thereof is changed with digital data to vary the tuning frequency. A high frequency stage of the VH band indicated in the item (B) is formed in this manner.

Further, third output terminals TC of the switch circuit 11 are connected to input terminals of the input buffer circuit 15C through the high frequency amplifier 13C, and the input terminal antenna tuning circuit 12C of the high frequency amplifier 13C is connected in parallel while the interstage tuning circuit 14C is connected in parallel to the input terminals of the input buffer circuit 14C. In this instance, the tuning circuit 12C is configured such that a tuning coil L12C is externally connected to the IC 10 through terminal pins while a tuning capacitor C12C is built in the IC 10. Meanwhile, the tuning circuit 14C is configured such that a tuning coil L14C is externally connected to the IC 10 through terminal pins while a tuning capacitor C14C is built in the IC 10. A high frequency stage of the U band indicated in the item (C) is formed in this manner.

Then, output terminals of the input buffer circuits 15A to 15C are connected commonly to nodes P15, P15 and connected to input terminals of the mixer circuits 21I and 21Q. Further, the delay AGC voltage VDAGC is supplied from the forming circuit 43 to the high frequency amplifiers 13A to 13C.

Further, a reception band switching signal SBAND is supplied from the buffer memory 52 to the switch circuit 11, and this switching signal SBAND is supplied as a control signal for permission/inhibition of operation of the input buffer circuits 15A to 15C to the input buffer circuits 15A to 15C so that the input buffer circuits 15A to 15C are controlled in an interlocking relationship with the switching of the switch circuit 11. In short, the switch circuit 15 is formed from the input buffer circuits 15A to 15C.

With such a configuration as describe above, for example, where reception of the VL band indicated in the item (A) is selected with the switching signal SBAND, reception signals are supplied from the switch circuit 11 to the tuning circuit 12A and operation of the input buffer circuit 15A is permitted. However, the reception signals are not supplied to the tuning circuits 12B and 12C and besides operation of the input buffer circuits 15B and 15C is inhibited.

Accordingly, reception of the VL band indicated in the item (A) is permitted, and a channel (frequency) selected by the tuning circuits 12A and 14A is outputted to the nodes P15, P15 and supplied to the mixer circuits 21I and 21Q. And, similar operation is carried out also with regard to the reception bands of the items (B) and (C).

In this manner, with the high frequency stage shown in FIG. 3, a reception band of the item (A) to (C) is selected, and a channel in the selected reception band can be selected. And, in this instance, since only the tuning circuits 14A to 14C are connected to the high frequency amplifiers 13A to 13C, respectively, the load is light and the high frequency amplifiers 13A to 13C provide low distortion.

[2-2] Example of the Configuration of the Switch Circuit 11

Figure 4:
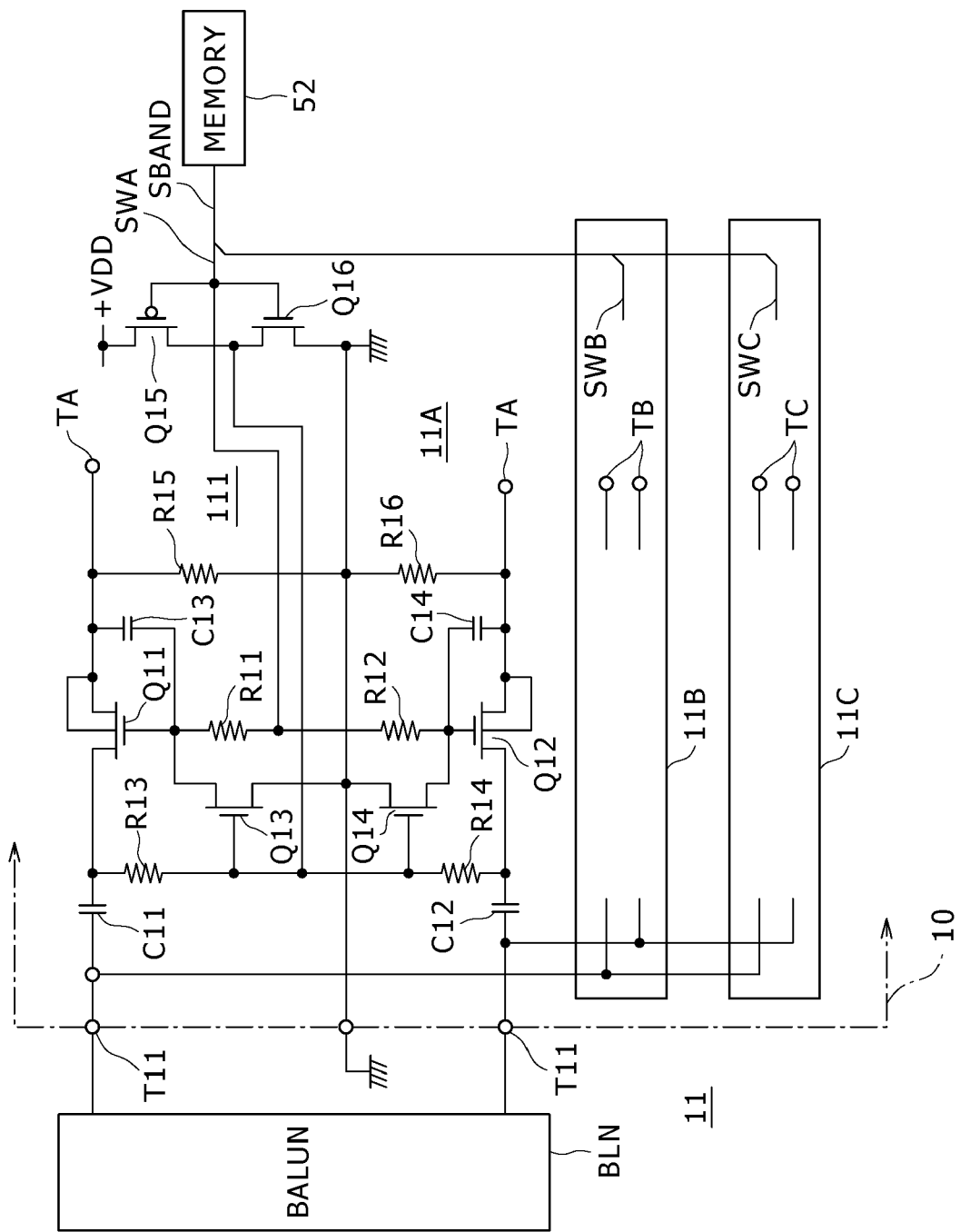
FIG. 4 is a connection diagram showing a form of an inputting section at a high frequency stage.

FIG. 4 shows an example of a particular configuration of the switch circuit 11. In this example, the switch circuit 11 is formed from three switch circuits 11A to 11C which controls signal lines between on and off. The switch circuits 11A to 11C are connected in series to signal lines between the terminal pins T11, T11 and the tuning circuits 12A to 12C, respectively. It is to be noted that, in the following description, not only an N-channel MOS-FET but also a P-channel MOS-FET are referred to simply as "FET" for the simplified description, and as occasion demands, the N channel and the P channel are referred to for distinction.

In particular, referring to FIG. 4, the terminal pins T11, T11 are connected to first output terminals TA, TA of the switch circuit 11 through capacitors C11 and C12 and further through the drain-source path (or source-drain path) of N-channel FETs (Q11, Q12). It is to be noted that the output terminals TA, TA have the antenna tuning circuit 12A connected thereto and are connected to input terminals of the high frequency amplifier 13A as seen in FIG. 3.

Further, resistors R11 and R12 are connected in series between the gate of the FET (Q11) and the gate of the FET (Q12), and the drain-source paths of N-channel FETs (Q13, Q14) are connected between the gates of the FETs (Q11, Q12) and the ground. Further, the FETs (Q11, Q12) are connected at the back gate thereof to the sources of the FETs (Q13, Q14), and the FETs (Q13, Q14) are connected at the gate thereof to the drains of the FETs (Q11, Q12) through resistors R13 and R14.

Further, capacitors C13 and C14 of predetermined capacitance are connected between the sources and the gates of the FETs (Q11, Q12), and resistors R15 and R16 are connected between the sources of the FETs (Q11, Q12) and the ground.

Further, the switching signal SBAND of the reception band outputted from the buffer memory 52 is formed from switching signals SWA to SWC corresponding to the items (A) to (C) described hereinabove, and the switching signal SWA among them is supplied to a connection midpoint of the resistors R11 and R12 and is supplied to the gate of the FETs (Q13, Q14) through the inverter 111 formed from FETs (Q15, Q16) of complementary connection. Further, also the switch circuits 11B and 11C are formed similarly to the switch circuit 11A, and switching signals SWB and SWC are supplied thereto.

It is to be noted that the capacitors C11 and C12 have minimum capacitance which allows a reception signal SRX, which is controlled on/off by the switch circuit, to pass through the capacitors C11, C11 with minimum loss at the lowest frequency of the reception signal.

With such a configuration as described above, where a switching signal SWA of a reception band supplied from the buffer memory 52 to the switch circuit 11A has the "L" level, this is supplied to the gate of the FETs (Q11, Q12) through the resistors R11 and R12, and consequently, the FETs (Q11, Q12) are turned off. On the other hand, since the switching signal SWA is inverted by the inverter 111 and then supplied to the gate of the FETs (Q13, Q14), the FETs (Q13, Q14) are turned on. As a result, the reception signal SRX supplied to the terminal pins T11, T11 is blocked by the FETs (Q11 to Q14) and is not outputted to the output terminals TA, TA.

However, where the switching signal SWA for the reception band has the "H" level, since this is supplied to the gate of the FETs (Q11, Q12) through the resistors R11 and R12, the FETs (Q11, Q12) are turned on. Further, since the switching signal SWA is inverted by the inverter 111 and then supplied to the gate of the FETs (Q13, Q14), the FETs (Q13, Q14) are turned off. As a result, the reception signal SRX supplied to the terminal pins T11, T11 is outputted to the output terminals TA, TA through the FETs (Q11, Q12).

Then, also the switch circuits 11B and 11C are controlled on and off similarly with the switching signals SWB and SWC, and as a result, the output of the reception signal SRX is controlled. Accordingly, the switch circuits 11A to 11C equivalently become the switch circuit 15 of three contacts for one circuit as shown in FIG. 1 equivalently, and the reception signal SRX supplied from the balun BLN to the terminal pins T11, T11 can be selectively supplied to the tuning circuits 12A to 12C.

Figure 5:
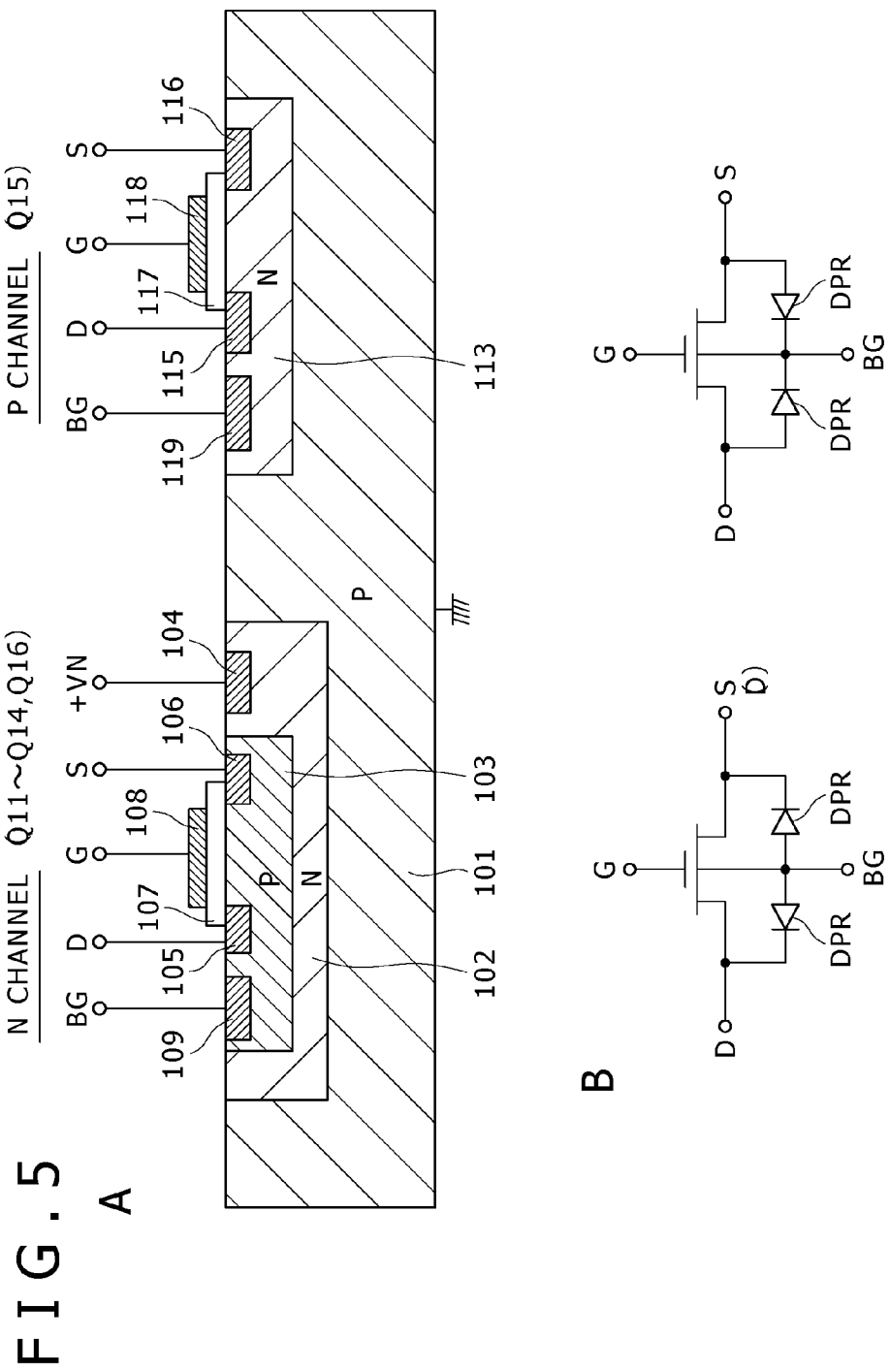
FIG. 5 is a sectional view of IC for explaining the circuit of FIG. 4.

And, in this instance, since the FETs (Q11 to Q16) have, for example, such a structure as shown in A of FIG. 5, such parasitic diodes DPR, DPR as shown in B of FIG. 5 are produced. However, even where the level of the reception signal SRX is high, the influence of the parasitic diodes DPR, DPR can be eliminated.

In particular, the left side of A of FIG. 5 shows a structure of an N-channel FET while the right side shows a structure of a P-channel FET. In the N-channel FET, an N-type isolation layer 102 is formed like an island on a P-type substrate 101, and a P-type region 103 is formed in the isolation layer 102. Further, at this time, an N+ region 104 is formed in the isolation layer 102, and an reverse bias voltage +VN is supplied to the N+ region 104 such that the P-type region 103 is isolated from the substrate 101.

Further, N+-type regions 105 and 106 are formed in the P-type region 103 and a drain terminal D and an source terminal S are led out, and an insulating layer 107 is formed on the surface between the region 105 and the region 106. A gate electrode 108 is formed on the surface of the insulating layer 107 and a gate terminal G is led out. Further, a P+ region 108 is formed in the region 103, and a back gate terminal BG is led out from this P+ region 108.

Meanwhile, in the P-channel FET, an N-type region 113 is formed on the P-type substrate 101, and P+ type regions 115 and 116 are formed in the N-type region 113 and the drain terminal D and the source terminal S are led out. Further, an insulating layer 117 is formed on the surface between the region 115 and the region 116, and a gate electrode 118 is formed on the surface of the insulating layer 117 and the gate terminal G is led out. Further, a P+ region 119 is formed in the N-type region 113, and the back gate terminal BG is led out from the P+ region 119.

Accordingly, in the N-channel FET, since a PN junction is provided between the region 103 and the regions 105 and 106. As a result, parasitic diodes DPR, DPR are produced between the back gate and the drain and source as seen in FIG. 5B. Further, also in the P-channel FET, parasitic diodes DPR, DPR are produced similarly.

Therefore, where the level of the reception signal SRX supplied to the switch circuit 11A is high, the parasitic diodes DPR, DPR may be turned on.

However, in the switch circuit 11A (to 11C) shown in FIG. 4, when the FETs (Q11, Q12) are off, the drains of the FETs (Q11, Q12) have the "H" level through the inverter 111 and the resistor R13 and the sources have the ground potential through the resistors R15 and R16. Therefore, the parasitic diodes DPR, DPR are reversely biased with a sufficiently high voltage, and consequently, even if the reception signal SRX of a high level is supplied to the switch circuit 11A, the parasitic diodes DPR, DPR can be ignored.

On the other hand, when the FETs (Q11, Q12) are on, the parasitic diodes DPR, DPR are shunted by the on-resistance of the FETs (Q11, Q12), and at this time, the on resistance of the FETs (Q11, Q12) is sufficiently low. Therefore, even if the reception signal SRX of a high level is supplied to the switch circuit 11A, the parasitic diodes DPR, DPR can be ignored.

Accordingly, even where the level of the reception signal SRX is high, the influence of the parasitic diodes DPR, DPR generated in the FETs (Q11, Q12) can be eliminated.

Further, since the capacitors C13 and C14 are connected, when the FETs (Q11, Q12) are on, the gates of them have an equal potential in ac with that of the sources of them and the on resistance of the FETs (Q11, Q12) is not fluctuated by the reception signal SRX passing therethrough, and appearance of distortion can be suppressed.

Accordingly, it is to be noted that the connection of the capacitors C13 and C14 may be between the drain and the gate of the FETs (Q11, Q12).

[2-3] Outline of the Input Circuit of the Mixer Circuits 21I and 21Q

Figure 6:
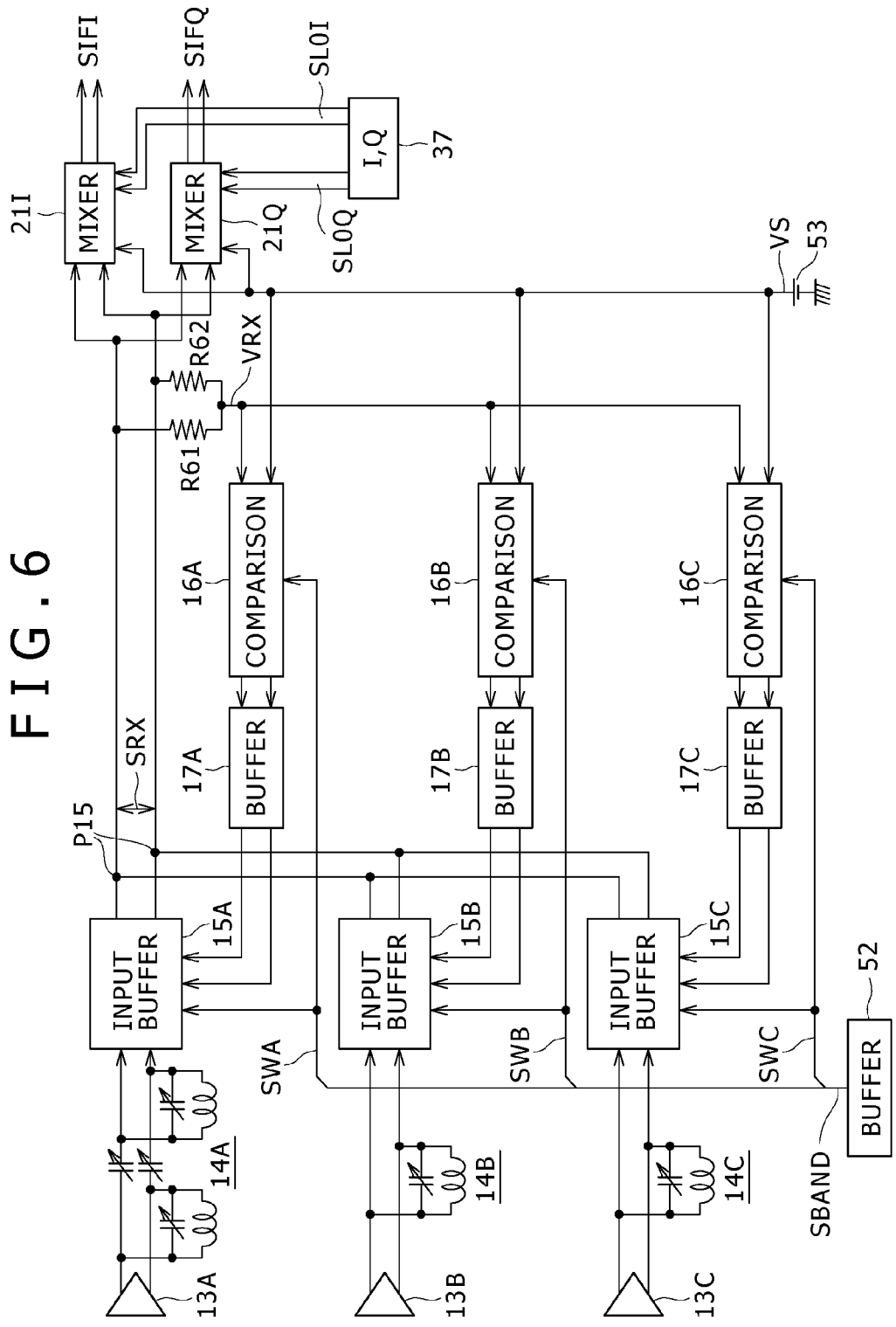
FIG. 6 is a connection diagram showing a form of an interstage section of the front end circuit.

Although details are hereinafter described, the mixer circuits 21I and 21Q are formed as those of the passive type from a switching circuit and a buffer amplifier. Therefore, for example, as shown in FIG. 6, although a predetermined reference voltage VS is supplied from the constant voltage circuit 53 to the mixer circuits 21I and 21Q. However, it is necessary to make the dc potential of the reception signal SRX to be supplied to the mixer circuits 21I and 21Q equal to the reference voltage VS.

Therefore, the input circuit of the mixer circuits 21I and 21Q is configured, for example, in such a manner as shown in FIG. 6. In particular, the output terminals of the input buffer circuits 15A to 15C are connected commonly to each other to form the pair of nodes P15, P15 as described hereinabove, and the switching signals SWA to SWC for the reception band are supplied from the buffer memory 52 to the input buffer circuits 15A to 15C. Consequently, the reception signal SRX of an object channel in an object reception band is outputted in balance to the nodes P15, P15.

And, the reception signal SRX outputted to the common nodes P15, P15 is supplied to the mixer circuits 21I and 21Q. Further, to the mixer circuits 21I and 21Q, local oscillation signals SLOI and SLOQ are supplied from the dividing circuit 37 and a predetermined reference voltage VS is supplied from the constant voltage section 53. Accordingly, signals SIFI and SIFQ are outputted from the mixer circuits 21I and 21Q.

Further, a pair of resistors R61 and R62 are connected in series between the common nodes P15, P15, and a dc potential VRX included in the reception signal SRX is extracted from a connection midpoint of the series connection. Then, this dc potential VRX is supplied to the voltage comparison circuit 16A and the reference voltage VS is supplied to the voltage comparison circuit 16A, and the two voltages are compared with each other. A comparison output of the voltage comparison circuit 16A is supplied as a signal for feedback controlling the dc potential to the input buffer circuit 15A through a buffer circuit 17A.

Similarly, the dc potential VRX and the reference voltage VS are compared with each other by a voltage comparison circuit 16B, and a comparison output of the voltage comparison circuit 16B is supplied as a feedback control signal for the dc potential to the input buffer circuit 15B through a buffer circuit 17B. Further, the dc potential VRX and the reference voltage VS are compared with each other by a voltage comparison circuit 16C, and a comparison output of the voltage comparison circuit 16C is supplied as a feedback control signal for the dc potential to the input buffer circuit 15C through a buffer circuit 17C.

It is to be noted that, at this time, the switching signals SWA to SWC from the buffer memory 52 are supplied as control signals for operation of the voltage comparison circuits 16A to 16C to the voltage comparison circuits 16A to 16C, and, from among the voltage comparison circuits 16A to 16C, only a voltage comparison circuit which corresponds to a reception band which is determined to be effective by the switch circuits 11 and 15 is permitted to operate while the other voltage comparison circuits are inhibited from operation.

With such a configuration as described above, for example, if operation of the input buffer circuit 15A is permitted by the band switching signal SBAND, then the dc potential VRX of the reception signal SRX outputted from the tuning circuit 14A and the reference voltage VS are compared with each other by the voltage comparison circuit 16A. Further, at this time, the voltage comparison circuits 16B and 16C are inhibited from operation. As a result, the comparison output of the voltage comparison circuit 16A is fed back to the input buffer circuit 15A through the buffer circuit 17A, and as a result of this feedback, the dc potential VRX of the reception signal SRX outputted from the tuning circuit 14A is made equal to the reference voltage VS.

Since the dc potential of the reception signal SRX and the reference voltage VS become equal to each other in the mixer circuits 21I and 21Q in this manner, the characteristic of the mixer circuits 21I and 21Q can be improved. Then, in this instance, an error voltage VERR from the voltage comparison circuits 16A to 16C is fed back in a common mode to the buffer circuits 15P and 15M, and since the feedback is carried out only in this common mode, little influence is had on the reception characteristic.

Figure 7:
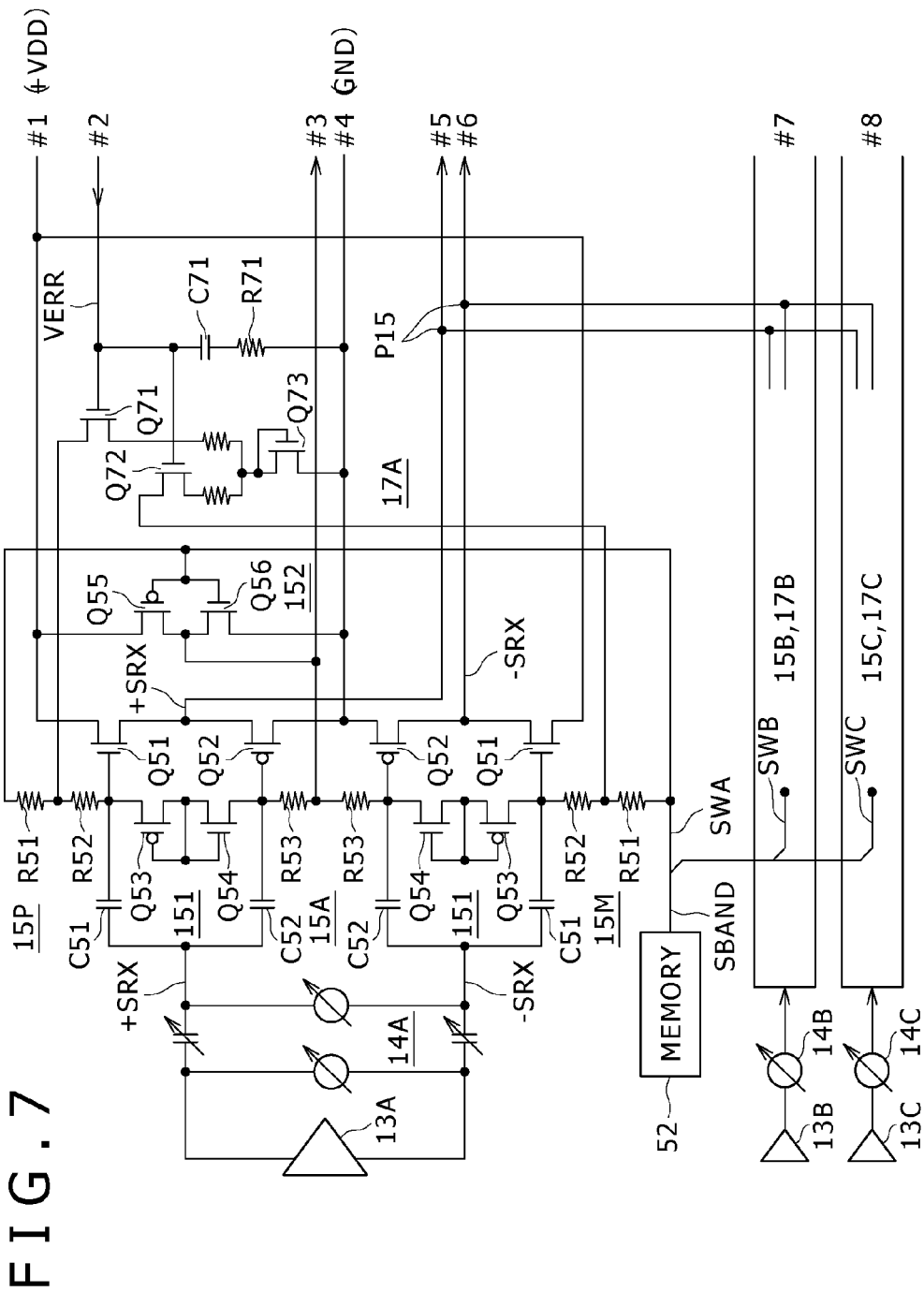
FIG. 7 is a connection diagram showing a portion of a form of the interstage section of FIG. 6.
Figure 8:
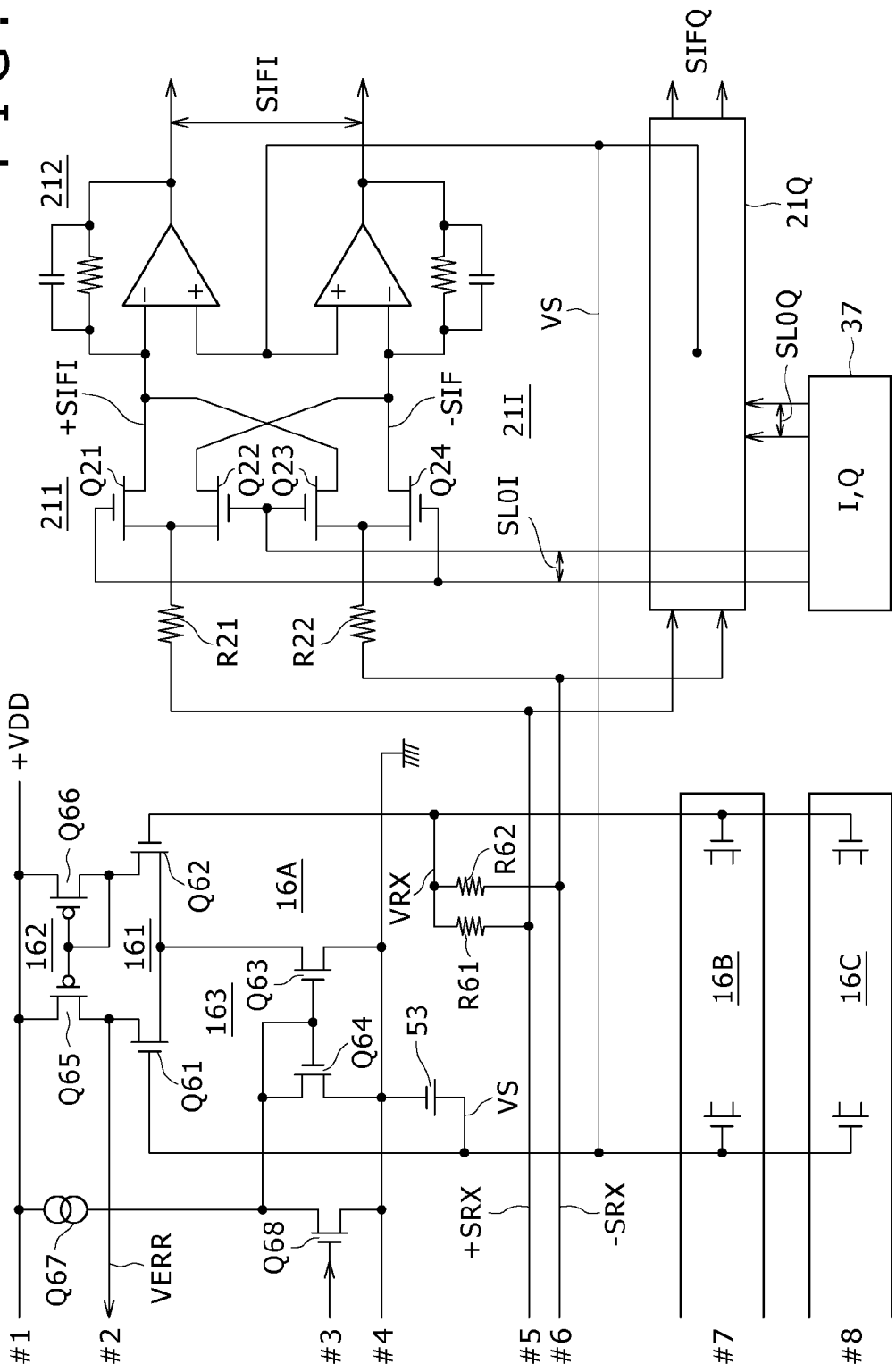
FIG. 8 is a connection diagram showing a continued portion from FIG. 7.

[2-4] Particular Example of the Mixer Circuits 21I and 21Q and the Input Circuit for Them FIGS. 7 and 8 show a particular connection example of the mixer circuits 21I and 21Q and the input circuit for them. In FIGS. 7 and 8, the input circuit is shown in a divided form for the convenience of illustration, and #1 to #8 in FIG. 7 and FIG. 8 are connected to each other. It is to be noted that also the signal system of the input circuit is formed as that of the balance type similarly to the reception signal system.

Then, FIG. 7 principally shows the input buffer circuit 15A of the switch circuit 15, and this input buffer circuit 15A is composed of a buffer circuit 15P which handles reception signal +SRX which is one of reception signals ±SRX of the balance type and another buffer circuit 15M which handles the other reception signal −SRX.

Then, the reception signals ±SRX of the balance type are extracted from the tuning circuit 14A, and in the input buffer circuit 15P, the reception signal +SRX is supplied to the gate of the FETs of the source follower connected in complementary connection, that is, to the gate of an N-channel FET (Q51) and a P-channel FET (Q52), through capacitors C51 and C52. Further, a predetermined bias voltage is supplied to the gates from a bias circuit 151.

This bias circuit 151 is formed from resistors R51 and R52, the drain-source path of a P-channel FET (Q53), the source-drain path of an N-channel FET (Q54) and the resistor R53 connected in series.

Then, the switching signal SWA from within the switching signal SBAND for the reception band from the buffer memory 52 is supplied to the resistor R51 of the bias circuit 151 and is supplied to a resistor R53 of the bias circuit 151 through an inverter 152 formed from a P-channel FET (Q55) and an N-channel FET (Q56). It is to be noted that the FETs (Q51, Q52) are connected at the source thereof to one of the nodes P15, P15.

Accordingly, where SBAND="H" level, the voltage of the "H" level is supplied to the resistor R51. Further, since SBAND="H" level, the FET (Q55) is off and the FET (Q56) is on, and the ground level of the ground line #4 is supplied to a resistor R55. As a result, an appropriate bias voltage is supplied from the bias circuit 151 (series circuit of the elements R51 to R53) to the gate of the FETs (Q51, Q52), and the FETs (Q51, Q52) operate in an active region. Therefore, the reception signal +SRX is extracted from the sources of the FETs (Q51, Q52) and outputted to the common node P15.

However, in the case of SBAND="L" level, the voltage of the "L" level is supplied to the resistor R51. Further, since SBAND="L" level, the FET (Q55) exhibits an on state and the FET (Q56) exhibits an off state, and a voltage of the power supply line #1 is supplied to the resistor R55. As a result, bias voltages of the opposite polarities are supplied from the bias circuit 151 to the gates of the FETs (Q51, Q52), and the FETs (Q51, Q52) exhibit an off state and outputting of the reception signal +SRX from the sources of the FETs (Q51, Q52) stops.

Accordingly, the buffer circuit 15P can switch the reception signal +SRX on and off and operates, when the reception signal +SRX is on, in an active region.

Meanwhile, also the buffer circuit 15M is configured quite similarly to the buffer circuit 15P, and accordingly, the buffer circuit 15M can switch the reception signal −SRX on and off. Further, when the reception signal −SRX is on, the buffer circuit 15M operates in an active region. Furthermore, also the input buffer circuits 15B and 15C are configured similarly to the input buffer circuit 15A.

Accordingly, in response to the band switching signal SBAND for the reception band, one of the input buffer circuits 15A to 15C operates effectively, and the reception signals +SRX selected by the tuning circuits 14A to 14C are extracted to the nodes P15, P15 through the buffer circuit which operates effectively.

And, the reception signals ±SRX extracted to the nodes P15, P15 are supplied to the mixer circuits 21I and 21Q as illustrated also in FIG. 8. The mixer circuits 21I and 21Q are formed as those of the passive type from a pair of switching circuits 211 and a pair of buffer amplifiers 212.

In particular, the reception signal +SRX is supplied commonly to the drain of the N-channel FETs (Q21, Q22), and the reception signal −SRX is supplied commonly to the drain of the N-channel FETs (Q23, Q24) through a resistor R22. Further, the sources of the FETs (Q21, Q23) are connected to each other, and the sources of the FETs (Q22, Q24) are connected to each other. The switching circuit 211 is formed in this manner.

Then, the local oscillation signal SLOI of the balance type is supplied from the dividing circuit 37 between the gates of the FETs (Q21, Q24) and the gates of the FETs (Q22, Q23), and the signal SIFI of the balance type is extracted from the switching circuit 211. The buffer amplifier 212 of the balance type is coupled directly to the switching circuit 211, and the signal SIFI is extracted from the buffer amplifier 212. It is to be noted that, at this time, the reference voltage VS is supplied from the constant voltage circuit 53 to the buffer amplifier 212.

Further, also the mixer circuit 21Q is formed similarly to the switching circuit 211, and the local oscillation signal SLOQ is supplied and the signal SIFQ of the balance type is extracted.

Then, in this instance, if the dc potential (=VRX) at the input terminal of the switching circuit 211 and the dc potential (=VS) at the output terminal of the switching circuit 211 have a difference therebetween (if they have a dc offset therebetween), then the difference potential equivalently becomes a dc input, and since this is switched with the local oscillation signals SLOI and SLOQ, noise increases or distortion increases or else a frequency component equal to that of the local oscillation signals SLOI and SLOQ leaks to the buffer amplifier 212. As a result, the characteristic of the mixer circuits 21I and 21Q drops.

Therefore, in order to make the dc potential at the input terminal and the dc potential at the output terminal of the switching circuit 211 equal to each other, the voltage comparison circuits 16A to 16C and the buffer circuits 17A to 17C described hereinabove in [2-3] are provided, and control of common mode feedback is carried out such that the dc potential at the input terminal of the switching circuit 211 may become equal to the dc potential at the output terminal of the switching circuit 211.

In particular, as shown in FIG. 8, N-channel FETs (Q61, Q62) are connected at the source thereof to the drain of an N-channel FET (Q63) to form a differential amplifier 161, and the reference voltage VS is supplied to the gate of the FET (Q61). Meanwhile, the pair of resistors R61 and R62 are connected in series between the nodes P15, P15, and the dc potential VRX included in the reception signal SRX is extracted from a connection midpoint of the resistors R61 and R62. This reception signal SRX is supplied to the gate of the FET (Q62).

Further, the drains of P-channel FETs (Q65, Q66) are connected to the drains of the FETs (Q61, Q62). The FETs (Q65, Q66) form a current mirror circuit 162 wherein the power supply line #1 is a reference potential point and the FET (Q66) is the input side.

Further, the voltage obtained at the source of the FETs (Q55, Q56) of FIG. 7 is supplied to the gate of an N-channel FET (Q68) as shown in FIG. 8. This FET (Q68) is grounded at the source thereof and is connected at the drain thereof to a constant current source Q67. Further, the FET (Q68) is connected at this drain thereof to the drain of the FET (Q64). This FET (Q64) cooperates with the FET (Q63) to form a current mirror circuit 163 wherein the ground line #4 is a reference potential point and the FET (Q64) is the input side.

Accordingly, where the input buffer circuit 15A is effective (in an active state) in accordance with the switching signal SWA, since the sources of the FETs (Q55, Q56) have the "L" level, the FET (Q68) is off. As a result, output current of the constant current source Q67 is supplied to the FET (Q64), and constant current of a magnitude equal to that of the output current of the constant current source Q67 flows to the FET (Q63). Accordingly, the FETs (Q61, Q62) operate as the differential amplifier 161 and also the FETs (Q65, Q66) operate as the current mirror circuit 162.

As a result, the differential amplifier 161 compares the dc potential VRX (dc potential on the input side of the switching circuit 211) and the reference voltage VS (dc potential on the output side of the switching circuit 211), and the comparison output (error voltage) VERR between them is outputted from the drains of the FETs (Q61, Q65). In the present case, the error voltage VERR arises from the input buffer circuit 15A.

In other words, the differential amplifier 161 and the current mirror circuit 162 operate as the voltage comparison circuit 16A.

It is to be noted that, where the input buffer circuit 15B or 15C is effective in accordance with the switching signal SWB or SWC, then since the sources of the FETs (Q55, Q56) of the input buffer circuit 15A have the "H" level, the FET (Q68) is on. As a result, the output current of the constant current source Q67 is bypassed by the FET (Q68) and the FET (Q63) is turned off, and the differential amplifier 161 and the current mirror circuit 162 do not operate. As a result, even if the dc potential VRX is outputted from the connection midpoint of the resistors R61 and R62, the error voltage VERR is not outputted from the voltage comparison circuit 16A.

Then, in the present case, since the input buffer circuit 15A is controlled to an effective state in accordance with the switching signal SWA, the error voltage VERR from the voltage comparison circuit 16A is supplied to the gate of N-channel FETs (Q71, Q72), which form the buffer circuit 17A as shown in FIG. 7, and the sources of the FETs (Q71, Q72) are connected to the drain of a FET (Q73) for a constant current source. And, the FET (Q71) is connected at the drain thereof to a node between the resistor R51 and the resistor R52 of the bias circuit 151 of the buffer circuit 15P, and the FET (Q72) is connected at the drain thereof to a node between the resistor R51 and the resistor R52 of the bias circuit 151 in the buffer circuit 15M.

It is to be noted that, in the buffer circuit 17A, a capacitor C71 and a resistor R71 are for removing, when a component of the reception signal SRX remains in the error voltage VERR. Meanwhile, also the voltage comparison circuits 16B and 16C and the buffer circuits 17B and 17C are configured similarly to the voltage comparison circuit 16A and the buffer circuit 17A.

With such a configuration as described above, for example, where the input buffer circuit 15A is controlled to an effective state (active state) in accordance with the switching signal SWA, the error voltage VERR arising from the input buffer circuit 15A is outputted from the voltage comparison circuit 16A as described hereinabove, and this error voltage VERR is supplied to the gate of the FETs (Q71, Q72). Consequently, the voltage at the connection midpoint between the resistors R51 and R52 of the buffer circuit 15P and the voltage at the connection midpoint between the resistors R51 and R52 of the buffer circuit 15M vary in response to the magnitude of the error voltage VERR.

As a result, the dc potential at the sources of the FETs (Q51, Q52) and (Q51, Q52), that is, the dc potential VRX of the reception signals +SRX outputted from the input buffer circuit 15A, is feedback controlled so that it becomes coincident with the reference voltage VS of a reference. In other words, the dc potential on the input side and the dc potential on the output side of the switching circuit 211 become equal. Then, the operation described above is similar also where the input buffer circuit 15B or 15C is effective.

With the circuit of FIGS. 7 and 8, since a dc offset is prevented from appearing between the input side and the output side of the switching circuit 211 in this manner, increase of noise or distortion can be suppressed. Or the local oscillation signal SIFI (and SIFQ) supplied to the gate can be prevented from leaking to the buffer amplifier 2.

Further, although the input buffer circuits 15A to 15C require the capacitors C51 and C52, the capacitance of the capacitors C51 and C52 can be set to necessary minimum capacitance for each of the input buffer circuits 15A to 15C. For example, in the input buffer circuit 15C whose reception signal has a high frequency, the area required for the capacitors C51 and C52 is reduced. Accordingly, since also the parasitic resistance becomes low, attenuation of the reception signal SRX can be suppressed, and a drop of the reception sensitivity or a drop of C/N is not invited. Further, such a situation that an influence is had on the high frequency amplifiers 13A to 13C to increase the distortion does not occur.

Further, while a high passband filter is formed from the capacitors C51 and C52 and the input impedance of the FETs (Q51, Q52), since the FETs (Q51, Q52) form a source follower and the input impedance is high, even where the capacitors C51 and C52 have low capacitance, the cutoff frequency can be lowered, which is advantageous particularly with the input buffer circuit 15A which handles the lowest frequency band.

Further, since the load impedance to the FETs (Q51, Q52) is given only by the mixer circuits 21I and 21Q and the parasitic capacitance, the influence of the drop of the load as the rise of the frequency is small, and increase of distortion when the FETs (Q51, Q52) operate as a source follower can be suppressed.

Further, since the output impedance of the FETs (Q51, Q52) depends upon the bias current, the magnitude of the FETs (Q21, Q24) for switching and the resistors R21 and R22, if the conditions are selected, then the reception band can be switched efficiently among a plurality of reception bands.

Further, since the error voltage VERR from the voltage comparison circuits 16A to 16C is fed back in a common mode to the buffer circuits 15P and 15M and the feedback is used only in this common mode, the error voltage VERR has little influence on the reception characteristic.

[2-5] Particular Example of the Complex Band-Pass Filter 24

Figure 9:
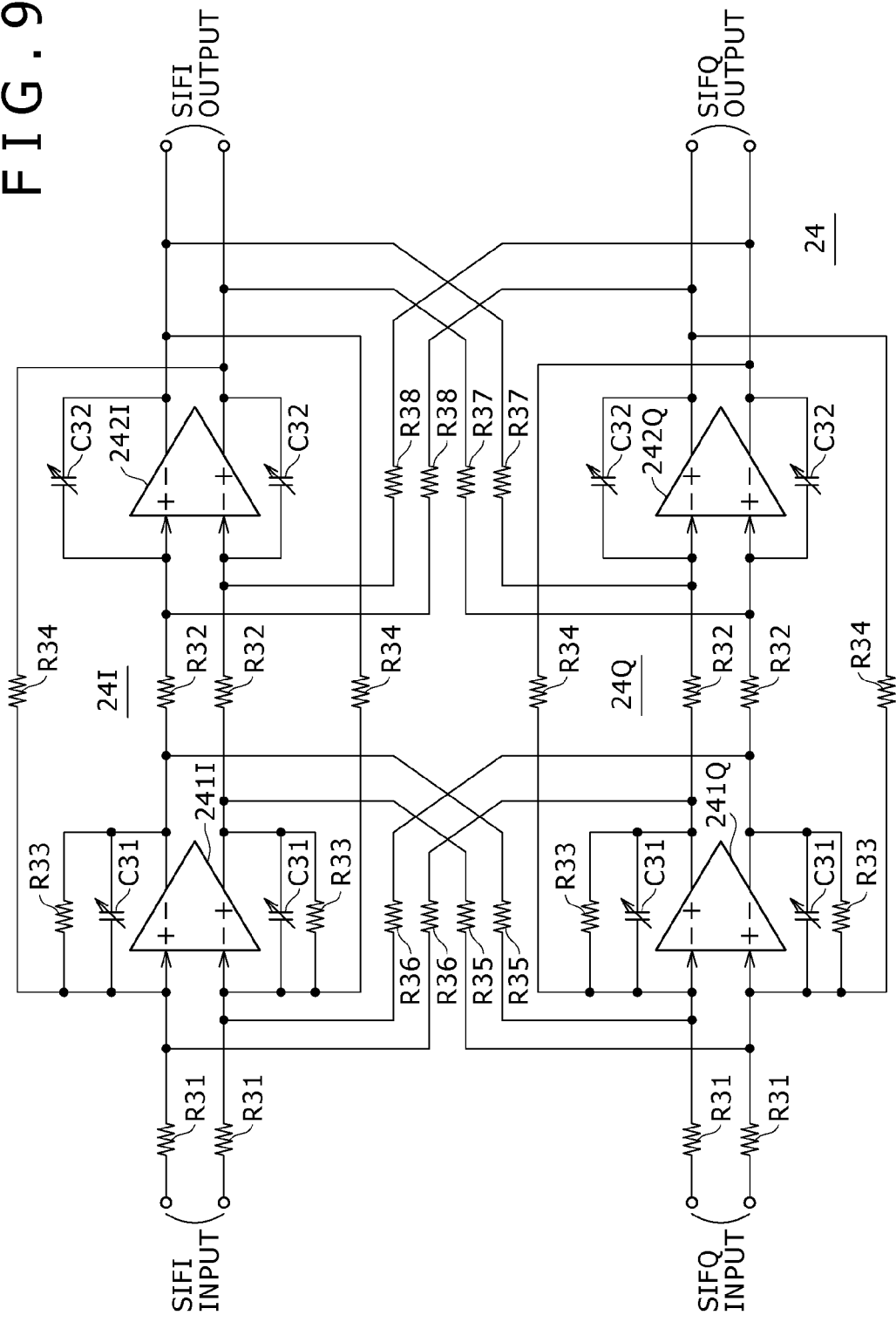
FIG. 9 is a connection diagram showing a form of a complex band-pass filter.

FIG. 9 shows an example of a particular connection scheme of the complex band-pass filter 24. In the present example, operational amplifiers 241I and 242I of differential inputs and differential outputs are provided, and a signal SIFI from the low-pass filter 22 at the preceding stage is supplied to the operational amplifier 241I through a pair of resistors R31, R31. An output of the operational amplifier 241I is supplied to the operational amplifier 242I through a pair of resistor R32, R32. Further, negative feedback is applied to the operational amplifier 241I through a pair of resistors R33, R33 and a pair of variable capacitors C31, C31 while negative feedback is applied to the operational amplifier 242I through a pair of variable capacitors C32, C32. Further, negative feedback is applied between the operational amplifiers 241I and 242I through a pair of resistors R34, R34. A low-pass filter 241 of the second order biquad type is formed in this manner.

Further, operational amplifiers 241Q and 242Q of differential inputs and differential outputs are provided, and the resistors R31 to R34 and the variable capacitors C31 and C32 are connected to the operational amplifiers 241Q and 242Q similarly as in the connection to the operational amplifiers 241I and 242I. Also here, a low-pass filter 24Q of the second order biquad type is formed. It is to be noted that a signal SIFQ from the low-pass filter 22 at the preceding stage is supplied to the operational amplifier 241Q through the resistors R31, R31.

Further, the operational amplifier 241I is connected at an output terminal thereof to an input terminal of the operational amplifier 241Q through a pair of resistors R35, R35, and the operational amplifier 241Q is connected at an output terminal thereof to an input terminal of the operational amplifier 241I through a pair of resistors R36, R36. Further, the operational amplifier 242I is connected at the output terminal thereof to the input terminal of the operational amplifier 242Q through a pair of resistors R37, R37, and the operational amplifier 242Q is connected at the output terminal thereof to the input terminal of the operational amplifier 242I through a pair of resistors R38, R38.

It is to be noted that, for example,

R32=R34

R35=R36=R37=R38

C31=C32 are satisfied.

A fourth-order complex band-pass filter 24 is formed from the low-pass filters 24I and 24Q in this manner, and signals SIFI and SIFQ represented by the expressions (5) and (6) are extracted from the operational amplifier 242I and 242Q.

And, if, in the complex band-pass filter 24,
ωC: cutoff frequency (angular frequency) of the low-pass filters 24I and 24Q
then $$\omega C=1/(C31 \cdot R32) \quad (8)$$

is satisfied, and if
ω0: center frequency (angular frequency) of the complex band-pass filter 24
BW: passband width of the complex band-pass filter 24
then $$\omega 0=1/(C31 \cdot R35) \quad (9)$$

$$BW=2 \cdot \omega C$$

are satisfied. In short, the pass-band width BW depends upon the cutoff frequency ωC.

And, if, at this time,
G: gain of the passband
then $$G \cdot \omega C=R33/R31$$

$$G \cdot \omega 0=R32/R31$$

and therefore, both of them depend upon a resistance ratio. And, since the resistance ratio is comparatively high in accuracy in an IC, the characteristic of the complex band-pass filter 24 can be adjusted by varying the values of the variable capacitors C31 and C32.

Further, although the cutoff frequency ωC and the center frequency ω0 define the passband of the complex band-pass filter 24, since $$\omega C/\omega 0=R35/R32$$

is derived from the expressions (8) and (9), if the value of the variable capacitors C31 and C32 is varied, then the pass-band width BW increases in proportion to the center frequency ωC while the frequency ratio ωC/ω0 remains fixed.

Accordingly, by varying the value of the variable capacitors C31 and C32, the dispersion of a characteristic upon fabrication can be absorbed while a filter characteristic of the complex band-pass filter 24 is maintained and the pass-band width BW and the center frequency ω0 can be changed simultaneously.

Further, since a resistance ratio of high accuracy is utilized and the value of the variable capacitors C31 and C32 is changed to control the characteristic of the complex band-pass filter 24, an object characteristic can be obtained readily and deterioration of the image removal characteristic can be suppressed.

[2-6] Particular Example of the Variable Capacitor

Figure 10:
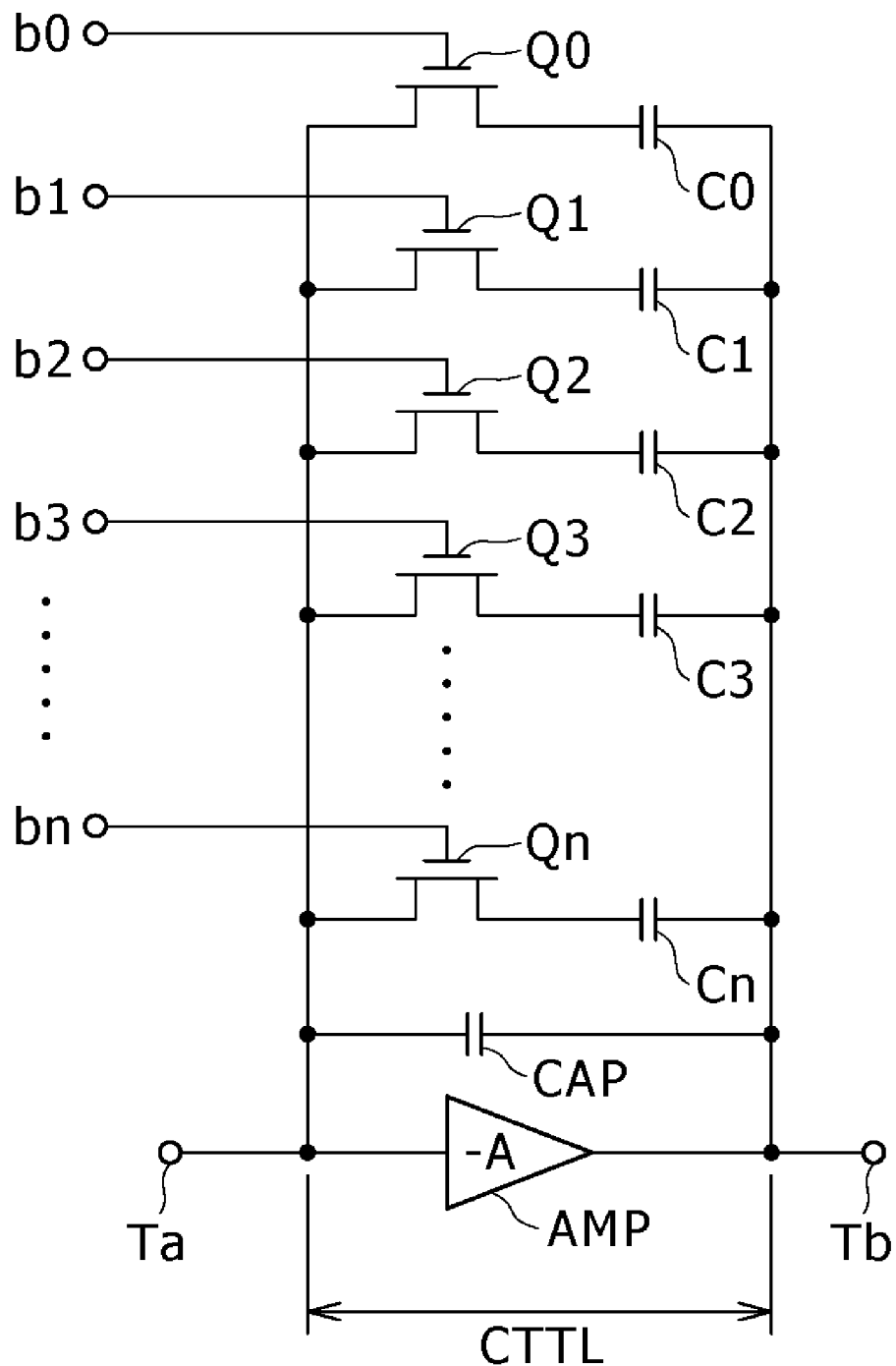
FIG. 10 is a connection diagram showing a form of a variable capacitor.

FIG. 10 shows a particular example of the variable capacitor which can be used as a variable capacitor for tuning of the tuning circuits 12A to 12C and 14A to 14C, the variable capacitors C31 and C32 of the complex band-pass filter 24 and so forth.

In particular, an inverting amplifier AMP having a sufficiently high gain is connected between terminals Ta and Tb, and a capacitor CAP is connected between the terminals Ta and Tb. Further, series circuits of the drain-source paths of FETs (Q0 to Qn) (n is a positive integer) and capacitors C0 to Cn are connected between the terminals Ta and Tb, and bits b0 to bn of a control signal of (n+1) bits are supplied to the gate of the FETs (Q0 to Qn).

Further, in this instance, the values of the capacitors C0 to Cn are set to $$Ci=C0 \times 2 \text{ to the ith power} \quad (10)$$

(i=0 to n)

It is to be noted that, as an example, in the case of the variable capacitor of the tuning circuits 12A to 12C and 14A to 14C, n=8, and in the case of the variable capacitors C31 and C32 of the complex band-pass filter 24, n=7.

With such a configuration as described above, the FET (Qi) is turned on or off in accordance with "H" or "L" of the bit bi, and when the FET (Qi) is on, the capacitor Ci connected in series thereto is connected in parallel to the capacitor CAP.

Accordingly, if
CTTL capacitance between the terminal Ta and the terminal Tb
then $$CTTL=CAP+Ci$$

is obtained.

And, since, at this time, the on/off states of the FETs (Q0 to Qn) provide a number of combinations equal to 2 to the (n+1)th power in accordance with the control signal b0 to bn and the value of the capacitors C0 to Cn is given by the expression (10), the capacitance C can be varied at a number of steps equal to 2 to the (n+1)th power in a unit of capacitance C0 within a range from $$CTTL=CAP$$

to $$CTTL=CAP+C0 \times (2 \text{ to the } (n+1)\text{th power}-1)$$

in accordance with the control signal b0 to bn. In short, the capacitance C of the capacitor can be varied to arbitrary capacitance by a necessary variation amount in accordance with digital data.

[3] Conclusion

The front end circuit described above can be concluded in the following manner. That is,

(11) An IC of one chip can cope with the wide frequency range of 46 to 887 MHz.

(12) The front end circuit 10 can be implemented from a reduced number of parts without deteriorating the disturbance characteristic over the wide frequency range.

(13) The single front end circuit 10 can cope with a difference in the broadcasting system such as digital broadcasting and analog broadcasting or with a difference in the broadcasting system among districts in the world.

(14) Since optimum AGC operation can be carried out from the D/U between the strength of a desired reception signal and the strength of many signals which are not desired to be received, a desired broadcast can be received favorably from among digital broadcasts or from among analog broadcasts or even if digital broadcasts and analog broadcasts are mixed.

(15) Also it is possible to form the tuning circuits 12A to 12C and 14A to 14C as an IC, and where tracking adjustment is carried out, if the tracking adjustment is carried out with digital data and an output signal of the terminal pin T13 is utilized, then the tracking adjustment can be carried out readily.

(16) Adjustment of various functions or measurement of a characteristic of the front end circuit 10 can be carried out with digital data, and automatic adjustment and automatic measurement can be carried out.

(17) Reception disturbance by harmonics of a clock signal and so forth is reduced, and as a result, the reception sensitivity is improved.

(18) Operation with a low voltage and low current consumption is possible.

(19) Since the circuit can be formed from the CMOS, a less expensive LSI can be obtained.

(20) Where an LSI is formed from the CMOS, since a fluctuation of the power supply voltage +VCC supplied to the terminal pin T17 is eliminated to form a fixed voltage by means of the built-in constant voltage section 53 and fine adjustment is carried out, even where the individual circuits are formed from MOS-FETs, the voltage to be supplied to the circuits can be set to a rather high voltage, and the performance of the MOS-FETs can be extracted to the utmost.

(21) Since all of the circuit parts of the PLL 30 except the capacitor C11 can be formed on a chip, the PLL 30 is formed so as to be tough against disturbance and suffer less likely from disturbance.

[4] Others

In the foregoing, also it is possible to use the local oscillation signals SLOI and SLOQ and the complex band-pass filter 24 to set the phase of the intermediate frequency signal components of the reception signal SRX in the signals SIFI and SIFQ opposite to each other and set the phases of the intermediate frequency signal components of the image interfering signal SUD opposite to each other. In this instance, if subtraction between the signal SIFI and the signal SIF1 is carried out, then the intermediate frequency signal SIF of the reception signal SRX can be obtained.

In particular, a phase relationship between the local oscillation signals SLOI and SLOQ and phase shifting of the complex band-pass filter 24 should be set in the signals SIFI and SIFQ such that the intermediate frequency signal components in the reception signal and the intermediate frequency signal components in the image interfering signal may have phases opposite to each other to carry out addition or subtraction of the signals SIFI and SIFQ.

Further, if the amplifier 25 subtracts the expression (6) from the expression (5), then $$SIF = SIFI - SIFQ$$
$$= 2\beta \cdot \cos\omega IFt$$
$$= EUD \cdot ELO \cdot \cos\omega IFt$$

and the image interfering signal SUD can be extracted. Consequently, the amplitude phase correction circuit 23 can correct the amplitude and the phase of the signals SIFI and SIFQ so that the image interfering signal SUD may be minimized.

Also it is possible to reverse the connection positions of the amplitude phase correction circuit 23 and the complex band-pass filter 24.

[List of Abbreviated Words]
A/D: Analog to Digital
AGC: Automatic Gain Control
C/N: Carrier to Noise ratio
CMOS: Complementary Metal Oxide Semiconductor
D/A: Digital to Analog
D/U: Desire to Undesire ratio
FET: Field Effect Transistor
IC: Integrated Circuit
IF: Intermediate Frequency
NF: Noise Figure
NTSC: National Television System Committee
PAL: Phase Alternation by Line
PLL: Phase Locked Loop
SECAM: Sequential a Memoire Color Television System
VCO: Voltage Controlled Oscillator

The invention claimed is:

1. A front end circuit, comprising:
a plurality of series circuits having tuning circuits and high frequency amplifiers individually corresponding to a plurality of reception bands into which television broadcasts are divided;
a first switch circuit for selectively supplying a reception signal to the plural series circuits;
a second switch circuit for selectively extracting an output of the plural series circuits in an interlocking relationship with said first switch circuit;
first and second mixer circuits to which the reception signal output from said second switch circuit is supplied
a PLL for supplying first and second local oscillation signals having phases orthogonal to each other to said first and second mixer circuits;
a complex band-pass filter to which outputs of said first and second mixer circuits are supplied; and
an output circuit for mathematically operating an output of said complex band-pass filter and outputting an intermediate frequency signal,
wherein,
the foregoing are formed as an integrated circuit, switching among the plural reception bands is carried out by switching of said first and second switch circuits, and
the tuning frequency of the tuning circuit in the switched reception band and the frequency of the first and second local oscillation signals to be supplied from said PLL to said first and second mixer circuits are varied to obtain an intermediate frequency signal of an object channel.

2. The front end circuit according to claim 1, wherein signal lines from said first switch circuit to said output circuit are formed as those of the balance type.

3. The front end circuit according to claim 1, further comprising:
a low-pass filter provided in signal lines between said first and second mixer circuits and said complex band-pass filter for removing unnecessary frequency components;
a detection circuit for detecting the reception level with a predetermined value from an output of said low-pass filter; and
a forming circuit for forming a delay AGC voltage from a detection output of said detection circuit and an AGC voltage,
wherein,
the AGC voltage is used to carry out AGC for the intermediate frequency signal, and
the delay AGC voltage is used to carry out delay AGC at a stage preceding to said first and second mixer circuits.

4. The front end circuit according to claim 2, wherein the pass band width and the center frequency of said complex band-pass filter are varied in response to a difference in a broadcasting system of a television broadcast to be received.

5. The front end circuit according to claim 4, wherein the gain for the intermediate frequency signal is varied in accordance with the broadcasting system of a television broadcast to be received.

6. The front end circuit according to claim 3, wherein the pass band width and the center frequency of said complex band-pass filter are varied in response to a broadcasting system of a television broadcast to be received, and said front end circuit further comprises a capacitor for absorbing dispersion by fabrication.

7. The front end circuit according to claim 1, wherein:
said first switch circuit and said second switch circuit are formed from MOS-FETs which are controlled between on and off with a switching signal for the reception band,
a tuning capacitor of each of said tuning circuits includes a plurality of capacitors, and
a MOS-FET controlled between on and off with a control signal to selectively connects the plural capacitors to a tuning coil.

8. The front end circuit according to claim 1, wherein an oscillation frequency of a VCO which composes said PLL is set higher than twice the frequency of the local oscillation signal.

9. The front end circuit according to claim 3, further comprising:
a different detection circuit for linearly detecting a signal level from the output of said low-pass filter; and
a terminal pin from which a detection output of said different detection circuit is extracted,
wherein,
a tuning characteristic of the tuning circuit is obtained from a voltage obtained at said terminal pin.

10. The front end circuit according to claim 1, further comprising a forming circuit for forming a signal of a reference frequency for said PLL from a clock, the clock being obtained from a baseband processing circuit for digitally processing the intermediate frequency signal.

11. The front end circuit according to claim 1, further comprising a constant voltage circuit having an output voltage which can be adjusted finely, an output of said constant voltage circuit being supplied to the components.

12. The front end circuit according to claim 1, further comprising a nonvolatile memory for storing set values for the components, the set values stored in said nonvolatile memory being supplied to the components to carry out setting of the components upon starting of the system.

* * * * *